United States Patent
Su et al.

(10) Patent No.: US 11,410,920 B2
(45) Date of Patent: Aug. 9, 2022

(54) APPARATUS, SYSTEM, AND METHOD FOR UTILIZING PACKAGE STIFFENERS TO ATTACH CABLE ASSEMBLIES TO INTEGRATED CIRCUITS

(71) Applicant: Juniper Networks, Inc., Sunnyvale, CA (US)

(72) Inventors: Peng Su, Sunnyvale, CA (US); Aliaskar Hassanzadeh, Sunnyvale, CA (US); Valery Kugel, Sunnyvale, CA (US); Gautam Ganguly, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 10 days.

(21) Appl. No.: 17/066,934

(22) Filed: Oct. 9, 2020

(65) Prior Publication Data

US 2022/0115309 A1    Apr. 14, 2022

(51) Int. Cl.
*H01L 23/498* (2006.01)
*H01L 23/40* (2006.01)
*H01R 12/70* (2011.01)
*H01R 12/71* (2011.01)
*H01R 13/639* (2006.01)

(52) U.S. Cl.
CPC .... *H01L 23/49811* (2013.01); *H01L 23/4006* (2013.01); *H01R 12/7082* (2013.01); *H01R 12/714* (2013.01); *H01R 13/639* (2013.01); *H01L 2023/4087* (2013.01)

(58) Field of Classification Search
CPC .......... H01L 23/49811; H01R 12/7082; H01R 17/714; H01R 13/629
See application file for complete search history.

(56) References Cited

U.S. PATENT DOCUMENTS

| | | | | |
|---|---|---|---|---|
| 5,007,843 A | * | 4/1991 | Smolley | G01R 1/07307 257/E23.172 |
| 5,358,412 A | * | 10/1994 | Maurinus | G02F 1/13452 349/150 |
| 5,530,291 A | * | 6/1996 | Chan | H05K 1/141 257/723 |
| 5,859,538 A | * | 1/1999 | Self | G01R 31/2886 324/754.07 |
| 7,411,282 B2 | * | 8/2008 | Furuyama | G02B 6/4201 257/678 |
| 7,891,988 B2 | * | 2/2011 | Dittmann | H01R 13/2407 439/77 |
| 8,708,729 B2 | * | 4/2014 | An | H01R 12/79 439/331 |
| 9,306,302 B2 | * | 4/2016 | Leigh | H05K 7/1092 |
| 10,741,951 B2 | * | 8/2020 | Mason | H01R 43/0256 |

(Continued)

*Primary Examiner* — Neil Abrams
(74) *Attorney, Agent, or Firm* — FisherBroyles, LLP

(57) ABSTRACT

A disclosed apparatus may include (1) an integrated circuit electrically coupled to a substrate, (2) a plurality of electrical contacts that are disposed on the substrate and are electrically coupled to the integrated circuit via the substrate, (3) at least one cable assembly electrically coupled to the plurality of electrical contacts, and (4) a package stiffener physically coupled to the substrate around the integrated circuit such that the at least one cable assembly is accessible to at least one electrical cable. Various other apparatuses, systems, and methods are also disclosed.

20 Claims, 25 Drawing Sheets

(56) References Cited

U.S. PATENT DOCUMENTS

| 11,114,807 B2* | 9/2021 | Lloyd | H01R 31/005 |
| 2006/0035510 A1* | 2/2006 | Numata | H01L 23/66 |
| | | | 439/372 |
| 2022/0115309 A1* | 4/2022 | Su | H01L 23/16 |

* cited by examiner

APPARATUS, SYSTEM, AND METHOD FOR UTILIZING PACKAGE STIFFENERS TO ATTACH CABLE ASSEMBLIES TO INTEGRATED CIRCUITS

BACKGROUND

Electronic components (such as integrated circuits) are often soldered to substrates and/or circuit boards by way of a process known as reflow soldering. For example, prior to a reflow process, solder paste may be disposed on contact pads located on a circuit board, and then electronic components may be placed on top of the solder paste, which holds the electronic components in position atop their corresponding contact pads. After the electronic components have been put in place, the substrate and/or circuit board may undergo a reflow process that heats the solder paste to a certain temperature. The temperature must be hot enough to melt the solder paste such that, once cooled off, the solder forms permanent connection joints between the electronic components and their corresponding contact pads.

Unfortunately, substrates and/or circuit boards may pose and/or represent a significant challenge during the soldering process. For example, a reflow process may apply so much heat that a substrate and/or circuit board warps. This warpage may bend the substrate and/or circuit board such that permanent connection joints are unable to form between the connection terminals on certain electronic components within the integrated circuit and the corresponding contact pads on the substrate and/or circuit board. As a result, those electronic components within the integrated circuit may fail to achieve full connectivity with the remaining components incorporated within the integrated circuit and/or other components laid out elsewhere (e.g., on the substrate and/or circuit board) within the corresponding system at large. Without full connectivity, the integrated circuit may fail to work as intended, thus leaving the corresponding system at large inoperable for its intended purpose.

Additionally or alternatively, some electrical components (such as integrated circuits and/or substrates) may experience a certain amount of warpage-even at room temperature. If the warpage exceeds a certain limit, some connection terminals on the electrical components may be unable to connect to others within the corresponding system at large. As a result, such electrical components may fail to achieve full connectivity with the others. Without full connectivity, those electrical components may fail to work as intended, thus leaving the corresponding system at large inoperable for its intended purpose.

In some examples, Application Specific Integrated Circuits (ASICs) may be electrically coupled to a substrate. In such examples, the substrate may also be electrically and/or physically coupled to a circuit board. Instead of running certain communication and/or electrical signals through the circuit board, some ASICs may benefit from having signal cables attached directly to the substrate (to, e.g., prevent signal interference and/or simplify the routing on the circuit board). Such ASICs may be high-powered and/or formatted as lidless packages that necessitate stiffeners to control and/or mitigate warpage. To be effective at mitigating such warpage, the stiffeners may need to be of a certain size and placed along the edges of the substrate. As cable connectors often demand and/or consume a significant amount of real estate, previous attempts at integrating such stiffeners and cable connectors on the substrate may have proved impractical and/or unworkable without increasing the size of the substrate and/or package. Unfortunately, increased substrate and/or package sizes may introduce certain drawbacks and/or disadvantages, such as increased material costs and/or additional real estate demands within the corresponding system at large.

The instant disclosure, therefore, identifies and addresses a need for apparatuses, systems, and methods for utilizing package stiffeners to attach cable assemblies to integrated circuits.

SUMMARY

As will be described in greater detail below, the instant disclosure generally relates to apparatuses, systems, and methods for utilizing package stiffeners to attach cable assemblies to integrated circuits. In one example, an apparatus for accomplishing such a task may include (1) an integrated circuit electrically coupled to a substrate, (2) a plurality of electrical contacts that are disposed on the substrate and are electrically coupled to the integrated circuit via the substrate, (3) at least one cable assembly electrically coupled to the plurality of electrical contacts, and (4) a package stiffener physically coupled to the substrate around the integrated circuit such that the at least one cable assembly is accessible to at least one electrical cable.

Similarly, a system for accomplishing such a task may include (1) a substrate electrically coupled to a circuit board, (2) an integrated circuit electrically coupled to the substrate, (3) a plurality of electrical contacts that are disposed on the substrate and are electrically coupled to the integrated circuit via the substrate, (4) at least one cable assembly electrically coupled to the plurality of electrical contacts, and (5) a package stiffener physically coupled to the substrate around the integrated circuit such that the at least one cable assembly is accessible to at least one electrical cable.

A corresponding method may include (1) disposing a plurality of electrical contacts on a substrate, (2) electrically coupling an integrated circuit to the substrate such that the substrate provides electrical continuity between the plurality of electrical contacts and the integrated circuit, (3) electrically coupling at least one cable assembly to the plurality of electrical contacts, and (4) physically coupling a package stiffener to the substrate around the integrated circuit such that the at least one cable assembly is accessible to at least one electrical cable.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
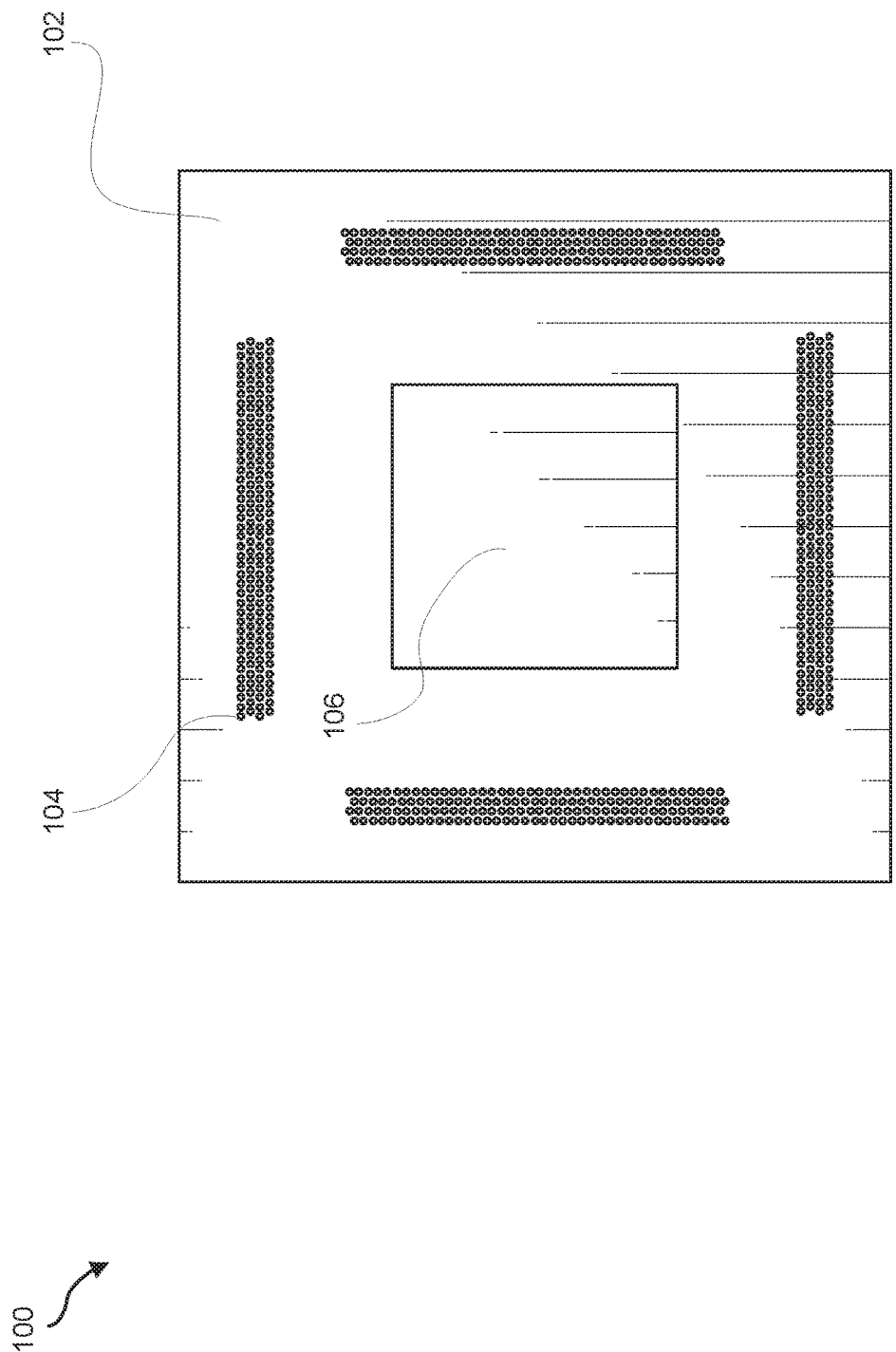
FIG. 1 is an illustration of an exemplary component that includes an integrated circuit electrically coupled to a substrate.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for utilizing package stiffeners to attach cable assemblies to integrated circuits. As will be explained in greater detail below, embodiments of the instant disclosure may be able to effectively integrate a package stiffer and cable assemblies atop the substrate of an ASIC without increasing the size of the substrate and/or overall package. Accordingly, such embodiments may avoid and/or prevent increased material costs and/or additional real estate demands associated with increased substrate and/or package sizes. Additionally or alternatively, such embodiments may be able to achieve this integration without necessitating significant modifications to current packaging structural designs, thereby avoiding and/or preventing increased costs associated with such design modifications.

The following will provide, with reference to FIG. 1-24, detailed descriptions of exemplary components, apparatuses, systems, configurations, and/or implementations for utilizing package stiffeners to attach cable assemblies to integrated circuits. In addition, the discussion corresponding to FIG. 25 will provide a detailed description of an exemplary method for utilizing package stiffeners to attach cable assemblies to integrated circuits.

Figure 2:
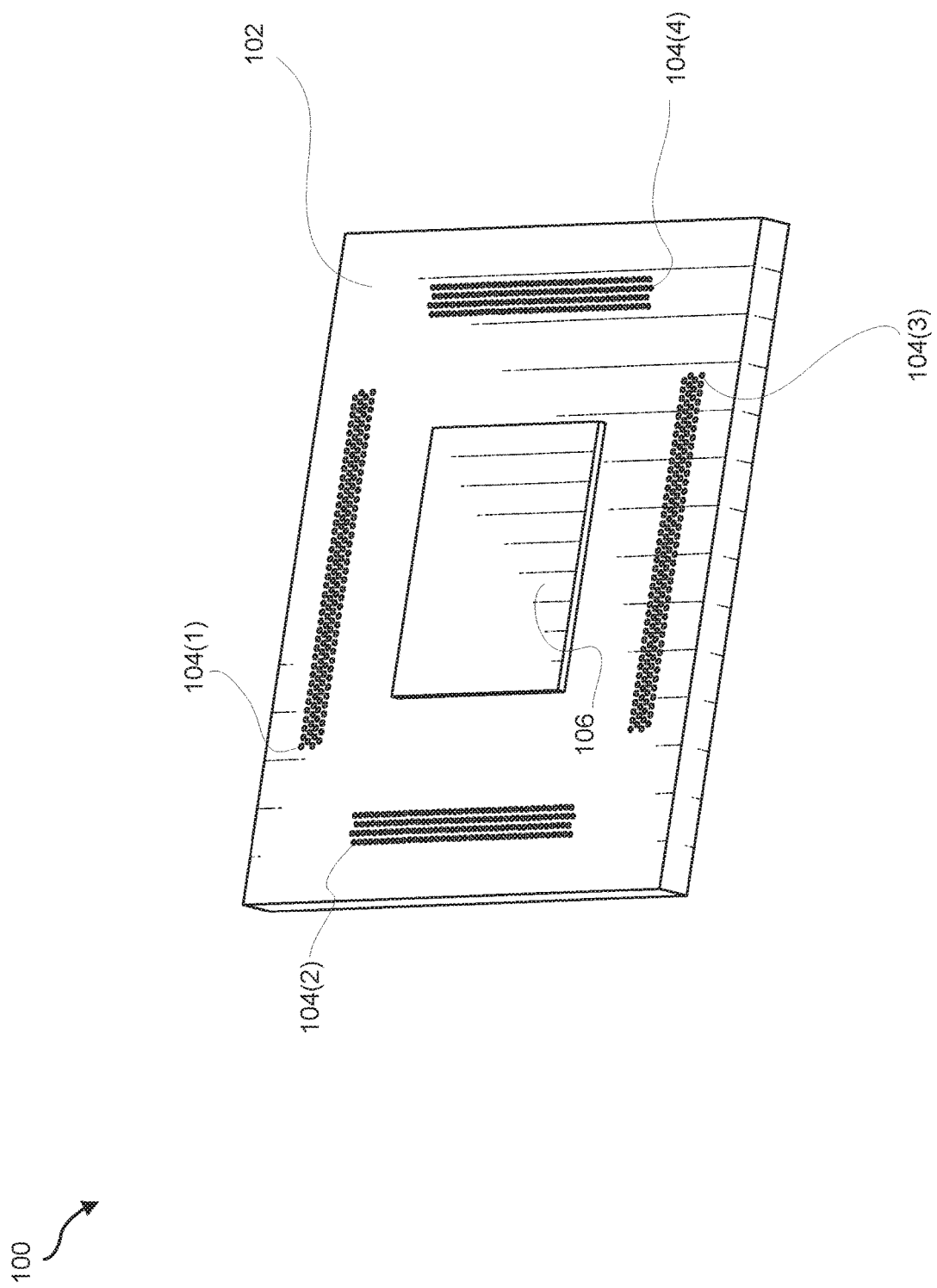
FIG. 2 is another illustration of the exemplary component that includes the integrated circuit electrically coupled to the substrate.

FIGS. 1 and 2 illustrate an exemplary component 100 that includes an exemplary integrated circuit 106 electrically coupled to an exemplary substrate 102. In some examples, integrated circuit 106 may include and/or represent a die and/or chip on which one or more passive and/or active electronic components are implemented, disposed, etched, and/or deposited. In this example, the passive and/or active electronic components may collectively form and/or serve as a lidless ASIC and/or a Systems on a Chip (SoC). Examples of such passive and/or active electronic components include, without limitation, transistors, diodes, resistors, capacitors, inductors, transducers, sensors, antennas, resonators, switches, optical devices, conductors, traces, wires, combinations of one or more of the same, and/or any other suitable electronic components.

In one example, integrated circuit 106 may include and/or represent a small, diced piece of semiconductor material. For example, integrated circuit 106 may include and/or represent a silicon wafer. In this example, integrated circuit 106 may include and/or contain one or more circuits that consist of various passive and/or active components. These circuits may be etched into the semiconductor material.

Although illustrated as a single unit in FIG. 2, integrated circuit 106 may alternatively include and/or represent multiple die attached and/or soldered to substrate 102. In one example, all the multiple die may be located and/or positioned near and/or toward the center and/or middle of substrate 102 to accommodate a package stiffener. In another example, the multiple die may be stacked together (using, e.g., a "through-silicon vias" technique) and then attached to substrate 206 as a stack. In a further example, a silicon interposer may be attached to substrate 102 first, after which integrated circuit 106 and/or other components may be attached to the silicon interposer (in, e.g., a "2.5D" package).

Integrated circuit 106 may be of various shapes and/or dimensions. In some examples, integrated circuit 106 may form a square, a rectangle, and/or a cube. Additional examples of shapes formed by integrated circuit 106 include, without limitation, ovals, circles, variations or combinations of one or more of the same, and/or any other suitable shapes.

Integrated circuit 106 may be sized in a particular way to fit within a certain electrical component of a computing device. Integrated circuit 106 may include and/or contain any of a variety of materials.

In some examples, substrate 102 may include and/or represent a die of semiconductor materials (such as silicon, germanium, and/or gallium arsenide). In other examples, substrate 102 may include and/or represent a die of electrical insulator materials (such as silicon dioxide, sapphire, aluminum oxide, polymers, and/or ceramics). Substrate 102 may include multiple layers of insulation materials. Substrate 102 may also include conductive traces (e.g., copper) and/or through-silicon vias that route signals from one layer to connection terminals and/or leads on another layer.

Substrate 102 may be of various shapes and/or dimensions. In some examples, substrate 102 may form a square, a rectangle, and/or a cube. Additional examples of shapes formed by substrate 102 include, without limitation, ovals, circles, variations or combinations of one or more of the same, and/or any other suitable shapes. Substrate 102 may be sized in a particular way to fit within a certain electrical component of a computing device.

As illustrated in FIG. 1, exemplary component 100 may also include and/or incorporate a plurality of electrical contacts 104 that facilitate electrical couplings. In some examples, electrical contacts 104 may be disposed on, along, and/or through substrate 102. In one example, electrical contacts 104 may include and/or represent a set of high-density of Land Grid Array (LGA) pads. In another example, electrical contacts 104 may include and/or represent a set of high-density of Ball Grid Array (BGA) pads.

In some examples, one or more of electrical contacts 104 may constitute and/or represent one side and/or end of conductors that span and/or extend to integrated circuit 106 through and/or across substrate 102. Accordingly, if an electrical cable is communicatively coupled to electrical contacts 104, signals carried by the electrical cable may traverse toward integrated circuit 106 via the conductors. Additionally or alternatively, if the electrical cable is communicatively coupled to electrical contacts 104, signals output by integrated circuit 106 may traverse toward another device (not illustrated in FIGS. 1 and 2) via the conductors and/or the electrical cable. In such examples, electrical contacts 104 may facilitate the transfer of Input/Output (I/O) signals exchanged with integrated circuit 106. In one embodiment, some of electrical contacts 104 may constitute and/or represent one side and/or end of conductors that span and/or extend to a circuit board (not necessarily illustrated in FIGS. 1 and 2) to which substrate 102 is electrically and/or physically coupled.

Electrical contacts 104 may be arranged and/or disposed through or across substrate (in, e.g., an LGA or BGA configuration and/or format). In some examples, electrical contacts 104 may include and/or represent a plurality of conductors incorporated into and/or arranged across substrate 102. In such examples, electrical contacts 104 may be spaced a certain distance and/or pitch (e.g., approximately 1 millimeter) from one another on substrate 102. In one example, each electrical contact may include and/or represent a single conductive piece and/or unit that facilitates electrical continuity between a contact pad on the electrical component and a conductive trace on the substrate 102.

In some examples, each electrical contact may include and/or represent an assembly of discrete conductive pieces and/or parts that combine to facilitate electrical continuity between integrated circuit 106 and another device (not illustrated in FIGS. 1 and 2) via the electrical cable. Each of electrical contacts 104 may be of any suitable shape and/or dimensions. In certain examples, electrical contacts 104 may be shaped and/or contoured to match and/or accommodate the layout of the electrical cable. Additionally or alternatively, electrical contacts 104 may be shaped and/or contoured to account and/or compensate for a certain degree of tolerance and/or variation.

Each of electrical contacts 104 may be sized in a particular way to ensure electrical continuity between integrated circuit 106 and another device (not illustrated in FIGS. 1 and 2) via the electrical cable. Each of electrical contacts 104 may include and/or represent any type or form of conductive material. In one example, each of electrical contacts 104 may include and/or represent a copper wire, lead, pad, and/or structure. Examples of conductive materials include, without limitation, coppers, steels, alloys, silvers, nickels, aluminums, variations or combinations of one or more of the same, and/or any other suitable type of conductive materials.

As illustrated in FIG. 2, exemplary component 100 may include and/or represent multiple sets of electrical components disposed on, along, and/or through different edges of substrate 102. For example, a set of electrical contacts 104(1) may be disposed proximate to a first edge of substrate 102, and a set of electrical contacts 104(2) may be disposed proximate to a second edge of substrate 102. In this example, a set of electrical contacts 104(3) may be disposed proximate to a third edge of substrate 102, and a set of electrical contacts 104(4) may be disposed proximate to a fourth edge of substrate 102.

Figure 3:
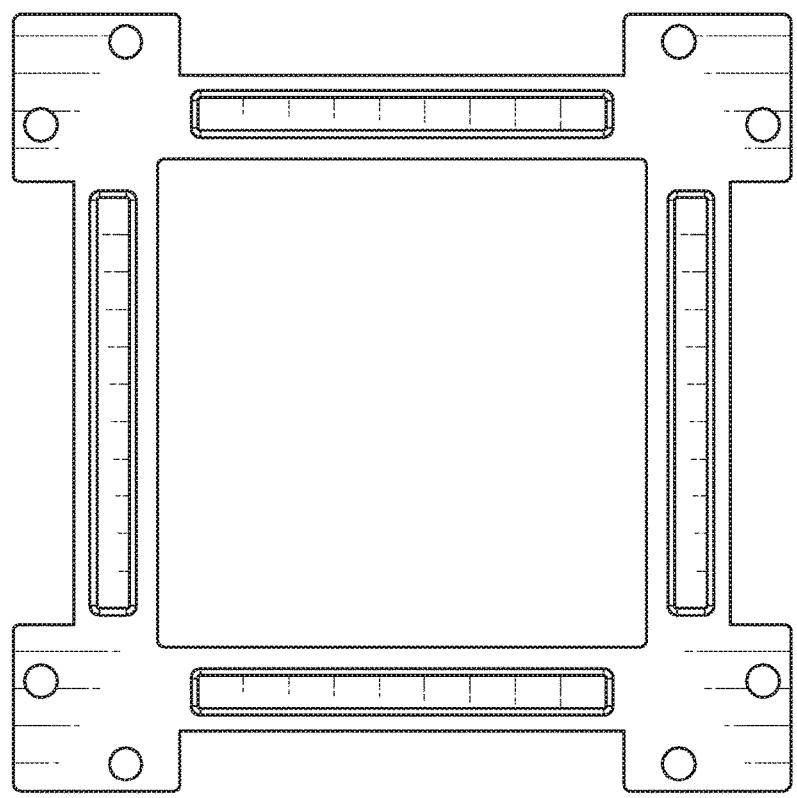
FIG. 3 is an illustration of an exemplary package stiffener.
Figure 4:
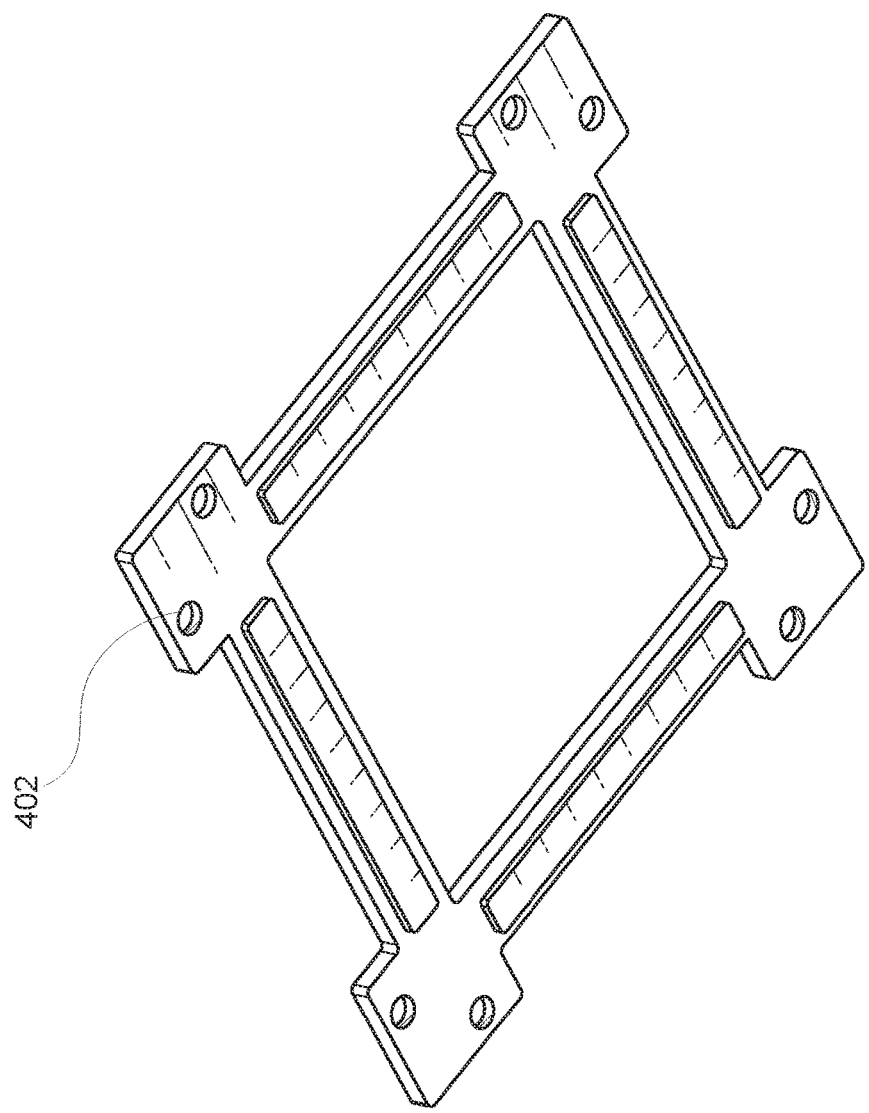
FIG. 4 is another illustration of the exemplary package stiffener.

FIGS. 3 and 4 illustrate an exemplary package stiffener 300 capable of being physically coupled to substrate 102. In some examples, package stiffener 300 may include and/or represent any type or form of physical material, structure, brace, and/or support feature that fastens, couples, and/or adheres to a substrate of an integrated circuit. In one example, package stiffener 300 may include and/or represent a ring that is fixed to the top surface of the substrate of a lidless integrated circuit. In this example, package stiffener 300 may at least partially surround and/or encompass the die of the lidless integrated circuit.

Package stiffener 300 may include and/or form any suitable shape. In some examples, package stiffener 300 may form a square, a circle, and/or a rectangle (e.g., a non-square rectangle). Additional examples of shapes formed by package stiffener 300 include, without limitation, triangles, pentagons, hexagons, octagons, ovals, diamonds, parallelograms, combinations or variations of one or more of the same, and/or any other suitable shapes.

In addition, package stiffener 300 may be of any suitable dimensions. In some examples, package stiffener 300 may be dimensioned to provide a certain amount of rigidity to substrate 102 to mitigate warpage of substrate 102. In one example, package stiffener 300 may encompass and/or extend beyond the perimeter of the package of the integrated circuit. In another example, package stiffener 300 may encompass and/or extend beyond the outline of the die(s) included on the integrated circuit.

Package stiffener 300 may include and/or contain any various materials. Examples of such materials include, without limitation, plastics, ceramics, polymers, metals, composites, combinations or variations of one or more of the same, and/or any other suitable materials.

In some examples, package stiffener 300 may serve as a foundation and/or base that provides structural support, tension, strength, and/or integrity to the integrated circuit and/or its substrate. In one example, package stiffener 300 may be placed, positioned, secured and/or coupled to the perimeter of the substrate and/or the integrated circuit prior to the reflow process in which the bottom surface of the substrate is soldered to a circuit board. After placement, package stiffener 300 may provide structural support and/or strength to the integrated circuit and/or its substrate. By providing structural support to the integrated circuit and/or its substrate in this way, package stiffener 300 may be able to impede and/or prevent the package and/or substrate of the integrated circuit from warping during the reflow process.

As illustrated in FIGS. 3 and 4, package stiffener 300 may include a set of borders dimensioned to substantially surround the integrated circuit. In one example, each of the borders may include and/or represent material designed and/or intended for placement atop the perimeter of the integrated circuit and/or its substrate. In this example, each of the borders may also include and/or represent material designed and/or intended to extend beyond the perimeter of the integrated circuit and/or its substrate to overhang a circuit board to which the integrated circuit is soldered.

In some examples, the borders may have differing and/or varying lengths relative to one another. For example, a first set of parallel borders may have the same length as one another, and a second set of parallel borders may have the same length as one another. However, in this example, the length of the first set of parallel borders may differ from the length of the second set of parallel borders.

In some examples, package stiffener 300 may include and/or incorporate at least a portion of an attachment mechanism for physically coupling to substrate 102. For example, package stiffener 300 may include and/or form one or more holes 402 (whether threaded or unthreaded). In this example, holes 402 may each include and/or represent an opening for a screw and/or bolt that facilitates securing and/or pressing package stiffener 300 to or against substrate 102. Alternatively, these openings may facilitate securing and/or pressing a load frame (not illustrated in FIGS. 3 and 4) against package stiffener 300. Additional examples of such attachment mechanisms include, without limitation, fasteners, screws, pins, spring-loaded locking or clamping mechanisms, adhesives, bolts, latches, anchors, ties, straps, nuts, threads, portions of one or more of the same, combinations and/or variations of one or more of the same, and/or any other suitable attachment mechanisms.

In some examples, package stiffener 300 may include, represent, and/or be shaped as a window frame. In such examples, the window frame may be intended for physically coupling along and/or near the perimeter of the substrate such that a certain amount of buffer space exists between the window frame and integrated circuit 106 atop substrate 102.

Figure 5:
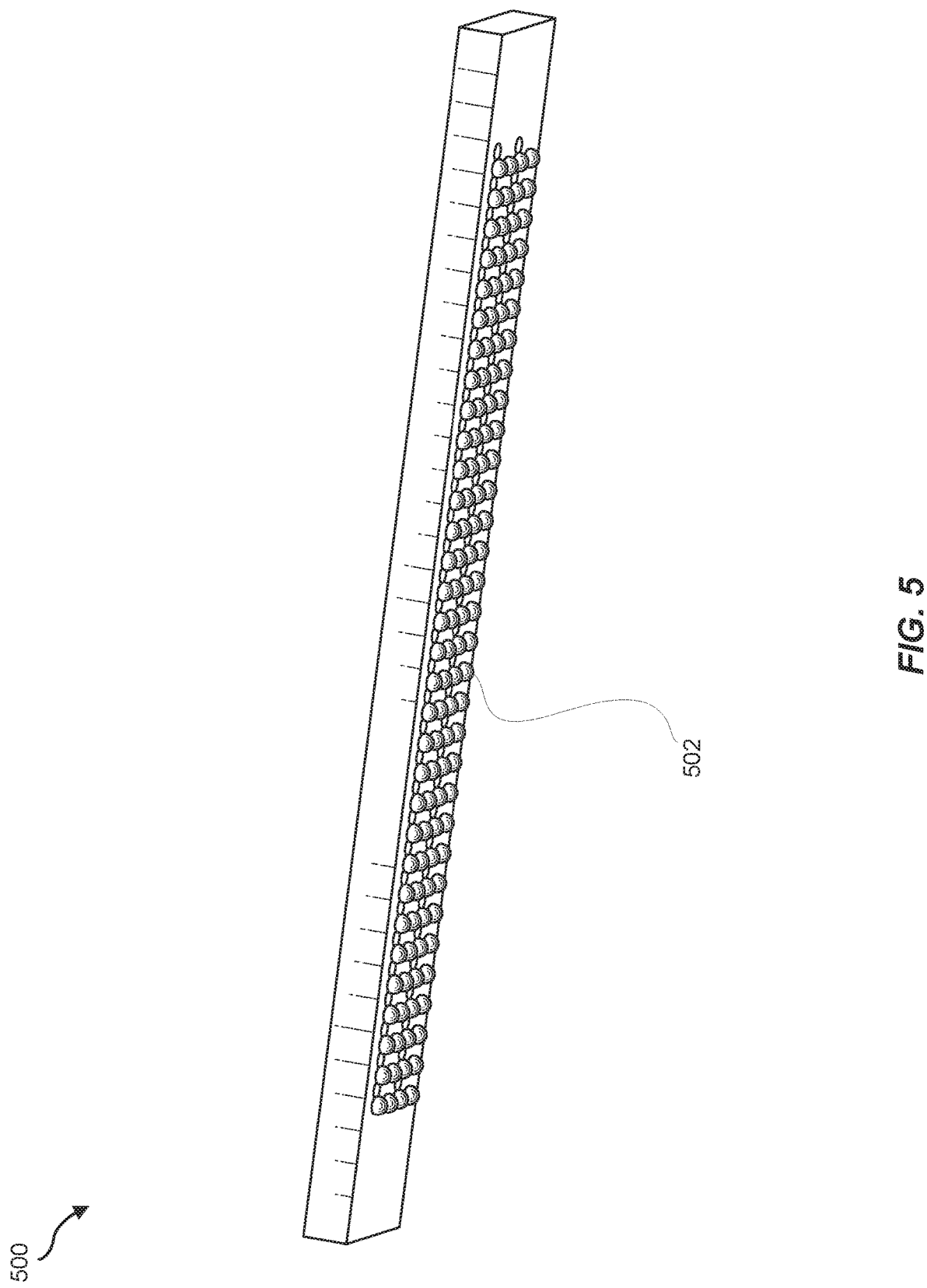
FIG. 5 is an illustration of an exemplary interposer.
Figure 6:
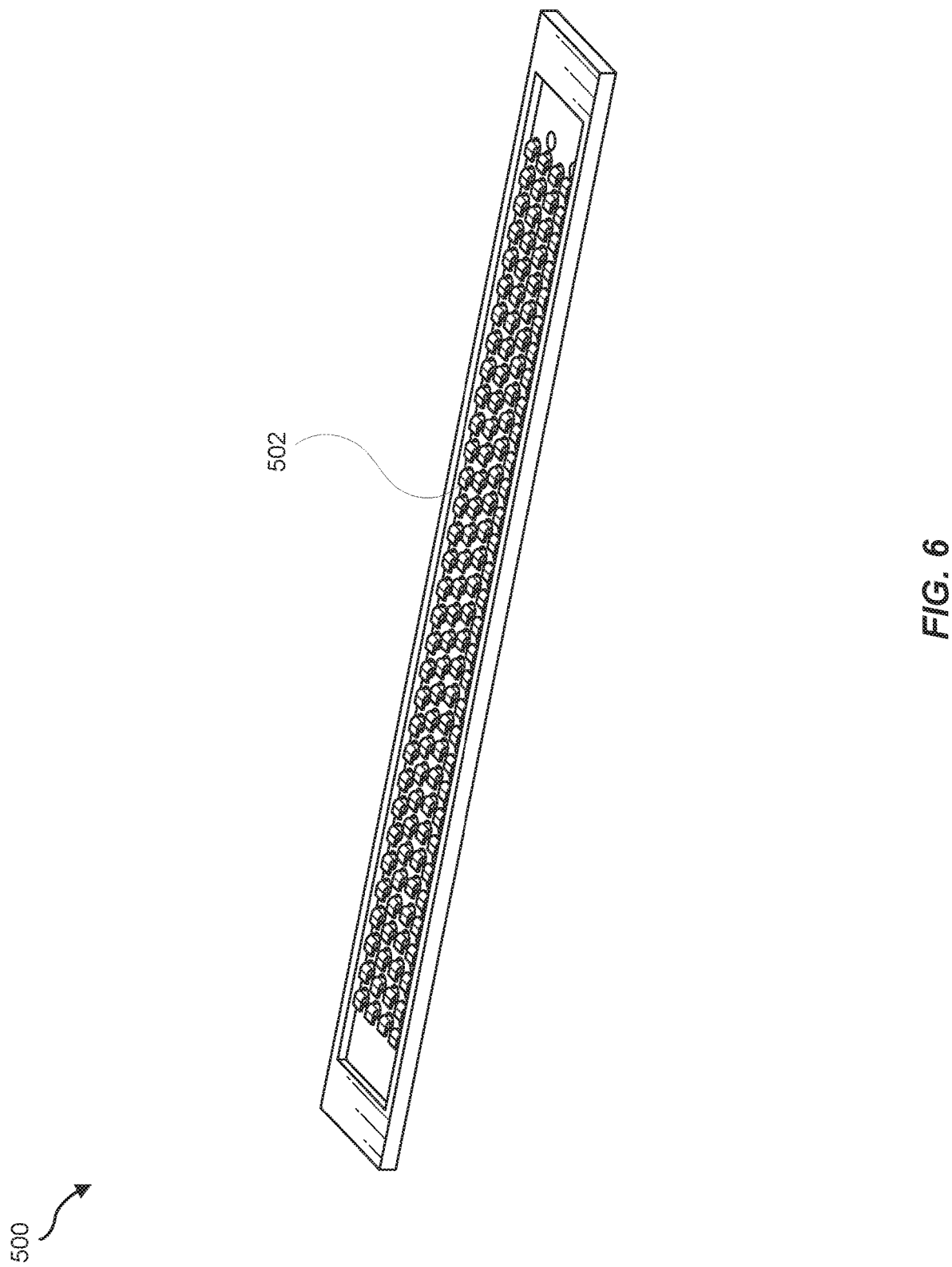
FIG. 6 is another illustration of the exemplary interposer.

FIGS. 5 and 6 illustrate an exemplary interposer 500 that facilitates electrically coupling one or more cable assemblies to electrical contacts 104 disposed on substrate 102. As illustrated in FIGS. 5 and 6, exemplary interposer 500 may include and/or represent a plurality of contact pins 502 laid out and/or arranged to correspond to and/or mate with electrical contacts 104. In some examples, contact pins 502 may be disposed through and/or across interposer 500 (in, e.g., an LGA or BGA configuration and/or format). In such examples, contact pins 502 may include and/or represent a plurality of conductors incorporated into and/or arranged across interposer 500.

In one example, contact pins 502 may be spaced a certain distance and/or pitch (e.g., approximately 1 millimeter) from one another on interposer 500. In this example, each contact pin may include and/or represent a single conductive piece and/or unit that facilitates electrical continuity from one side of interposer 500 to the other side. Additionally or alternatively, groups of contact pins 502 may constitute and/or represent signal pairs that run between integrated circuit 106 and another component included in the corresponding system at large.

Figure 7:
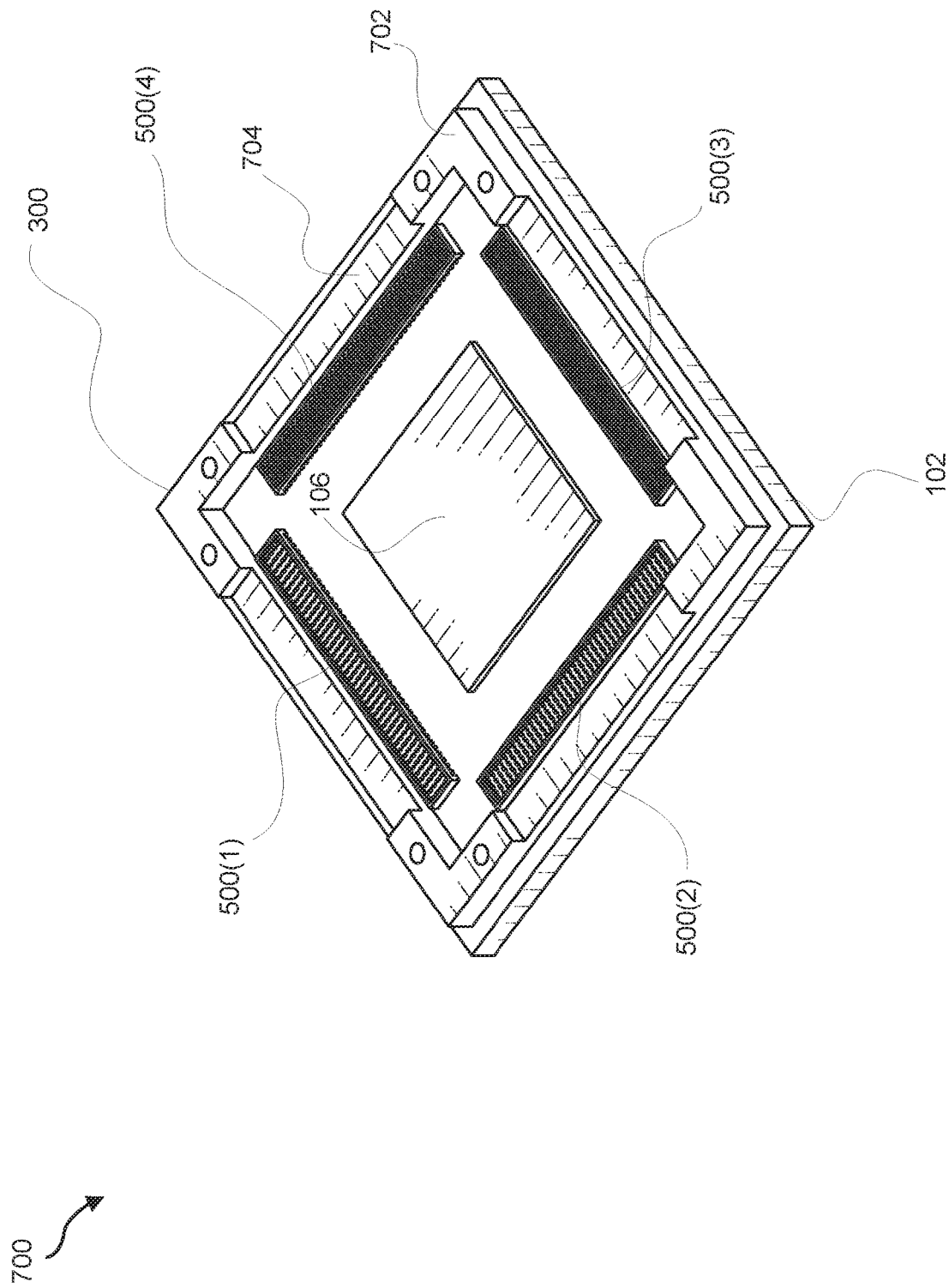
FIG. 7 is an illustration of an exemplary apparatus for utilizing package stiffeners to attach cable assemblies to integrated circuits.

FIG. 7 illustrates an exemplary apparatus 700 that utilizes package stiffener 300 to attach cable assemblies to integrated circuit 106. As illustrated in FIG. 7, exemplary apparatus 700 may include and/or represent integrated circuit 106, substrate 102, package stiffener 300, and/or interposers 500(1), 500(2), 500(3), and/or 500(4). In one example, interposers 500(1)-(4) may be electrically coupled to sets of electrical contacts 104(1)-(4), respectively, on substrate 102.

In some examples, integrated circuit 106 may be electrically coupled to substrate 102. In such examples, electrical contacts 104 may be disposed on substrate 102 and/or may be electrically coupled to integrated circuit 106 via substrate 102 such that electrical continuity exists between electrical contacts 104 and integrated circuit 106. In one example, package stiffener 300 may be physically coupled to substrate 102 around integrated circuit 106 such that one or more cable assemblies (not necessarily illustrated in FIG. 7) are still capable of being electrically coupled to electrical contacts 104 disposed on substrate 102.

As illustrated in FIG. 7, package stiffener 300 may include and/or form one or more lowered and/or depressed segments 704 that facilitates placement of one or more cable assemblies. For example, segments 704 may each include and/or represent a middle portion of a border between two corners of package stiffener 300. In some examples, package stiffener 300 may also include and/or form one or more raised and/or elevated segments 702 capable of supporting a load frame and/or a heatsink (not necessarily illustrated in FIG. 7). For example, segments 702 may each include and/or represent a corner of a border incorporated into package stiffener 300. In this example, a load frame and/or a heatsink may be physically coupled and/or attached to package stiffener 300 at segments 702.

Figure 8:
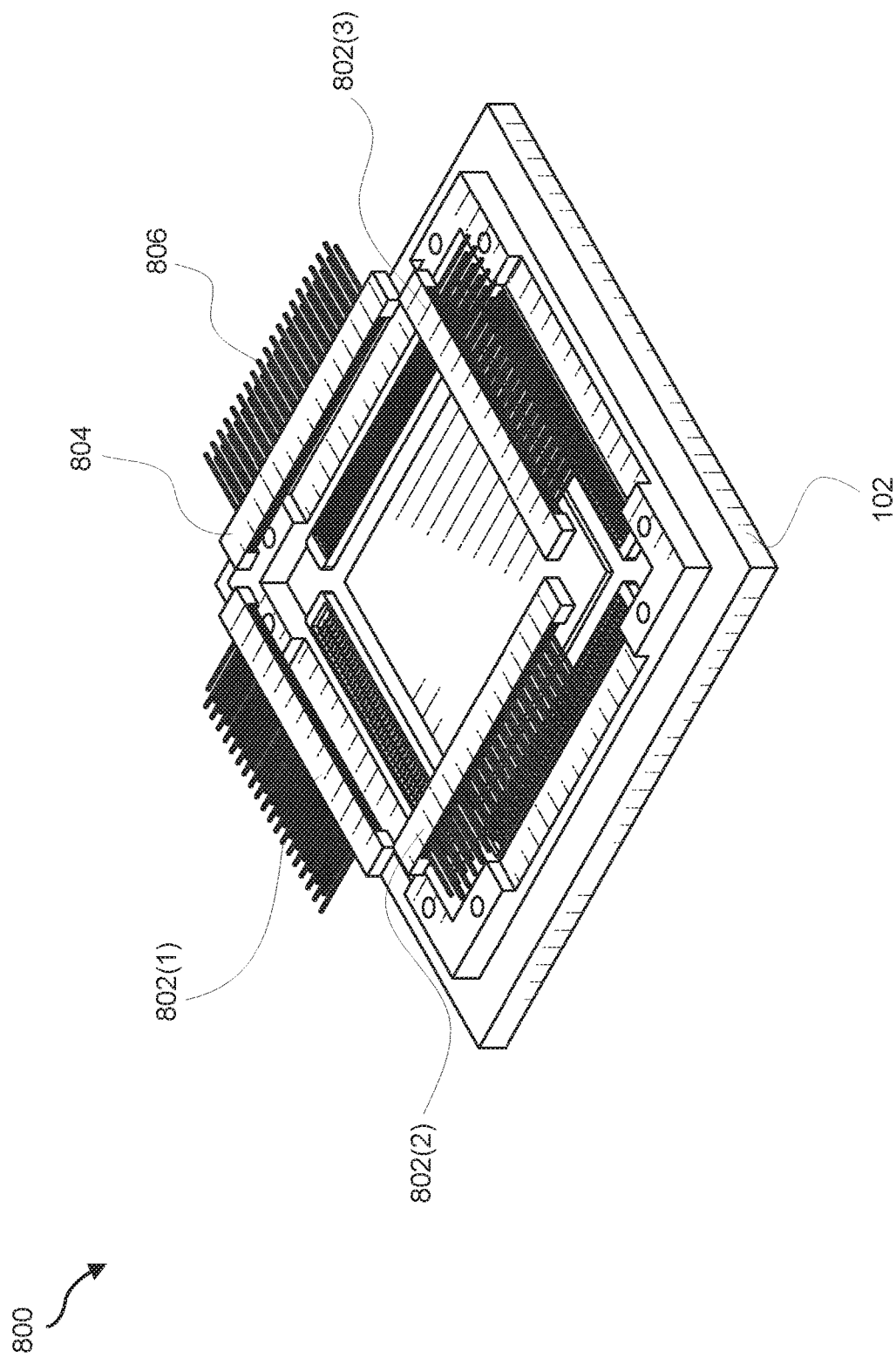
FIG. 8 is an illustration of an additional exemplary apparatus for utilizing package stiffeners to attach cable assemblies to integrated circuits.
Figure 9:
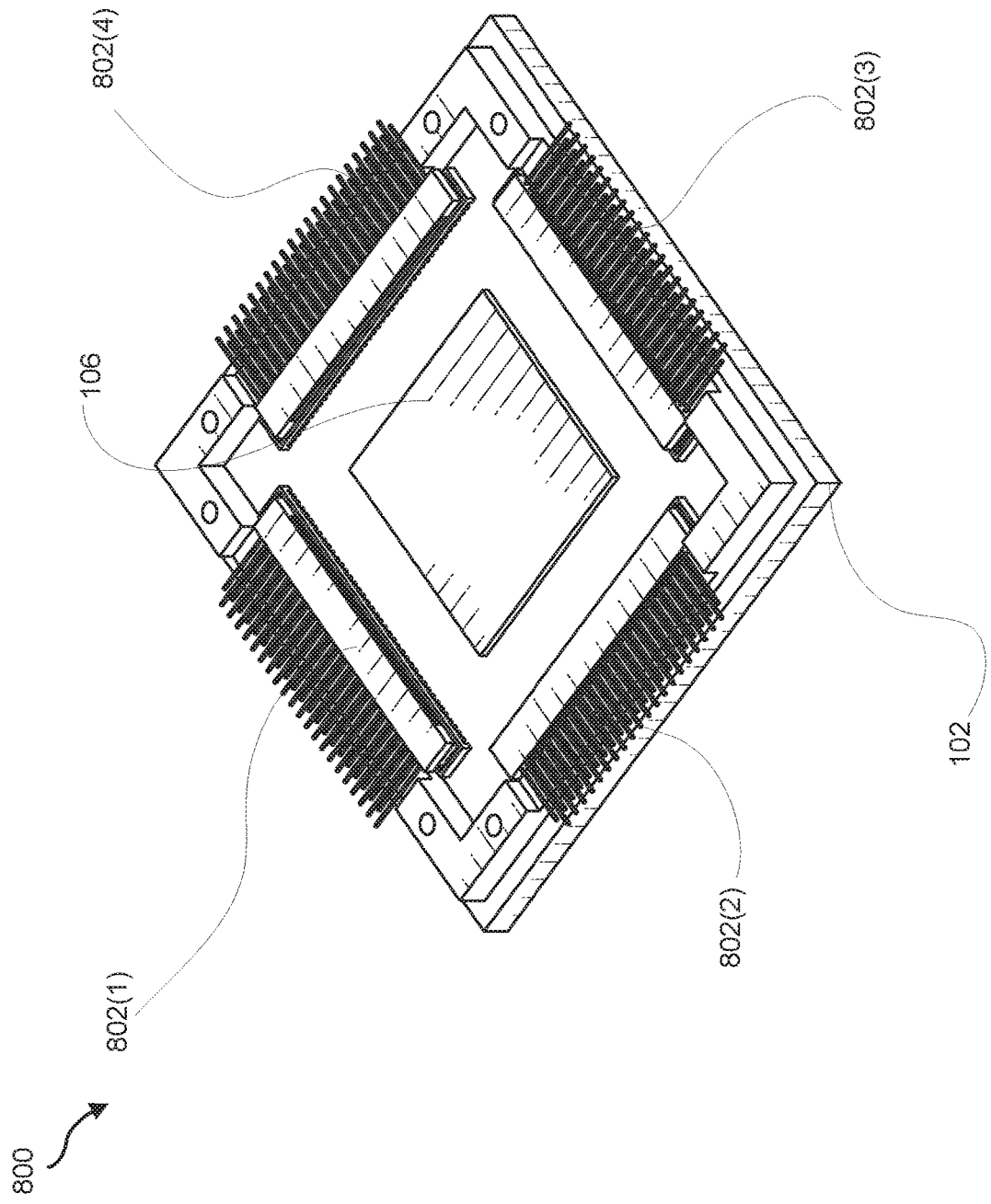
FIG. 9 is another illustration of the additional exemplary apparatus for utilizing package stiffeners to attach cable assemblies to integrated circuits.

FIGS. 8 and 9 illustrates an exemplary apparatus 800 that utilizes package stiffener 300 to electrically couple cable assemblies 802(1), 802(2), 802(3), and/or 802(4) to integrated circuit 106. In some examples, like apparatus 700 in FIG. 7, exemplary apparatus 800 may include and/or represent integrated circuit 106, substrate 102, package stiffener 300, and/or interposers 500(1), 500(2), 500(3), and/or 500(4). As illustrated in FIGS. 8 and 9, apparatus 800 may also include and/or represent cable assemblies 802(1)-(4) that are electrically coupled to interposers 500(1)-(4), respectively. Accordingly, interposers 500(1)-(4) may be electrically coupled between sets of electrical contacts 104(1)-(4) and cable assemblies 802(1)-(4).

In some examples, cable assemblies 802(1)-(4) may each include and/or represent an integration connector 804 and a plurality of electrical pins 806. In such examples, electrical pins 806 of each cable assembly may be laid out and/or arranged to correspond to and/or mate with one of interposers 500(1)-(4) and/or an electrical cable (not necessarily illustrated in FIGS. 8 and 9). In one example, electrical pins 806 may be integrated and/or grouped into a single unit that serves as a cable assembly. For example, integration connector 804 may hold and/or maintain electrical pins 806 in the arrangement needed to properly mate and/or couple an electrical cable with one of interposers 500(1)-(4).

In some examples, package stiffener 300 may be physically coupled along and/or near the perimeter of substrate 102 such that a certain amount of buffer space exists between package stiffener 300 and integrated circuit 106 atop substrate 102. In one example, sets of electrical contacts 104(1)-(4) may be positioned within that buffer space between package stiffener 300 and integrated circuit 106. As a result, integration connector 804 of each cable assembly may sit atop at least a portion of that buffer space, and electrical pins 806 of each cable assembly may run parallel to substrate 102 and/or extend outward from the portion of buffer space toward the corresponding edge of substrate 102.

Figure 10:
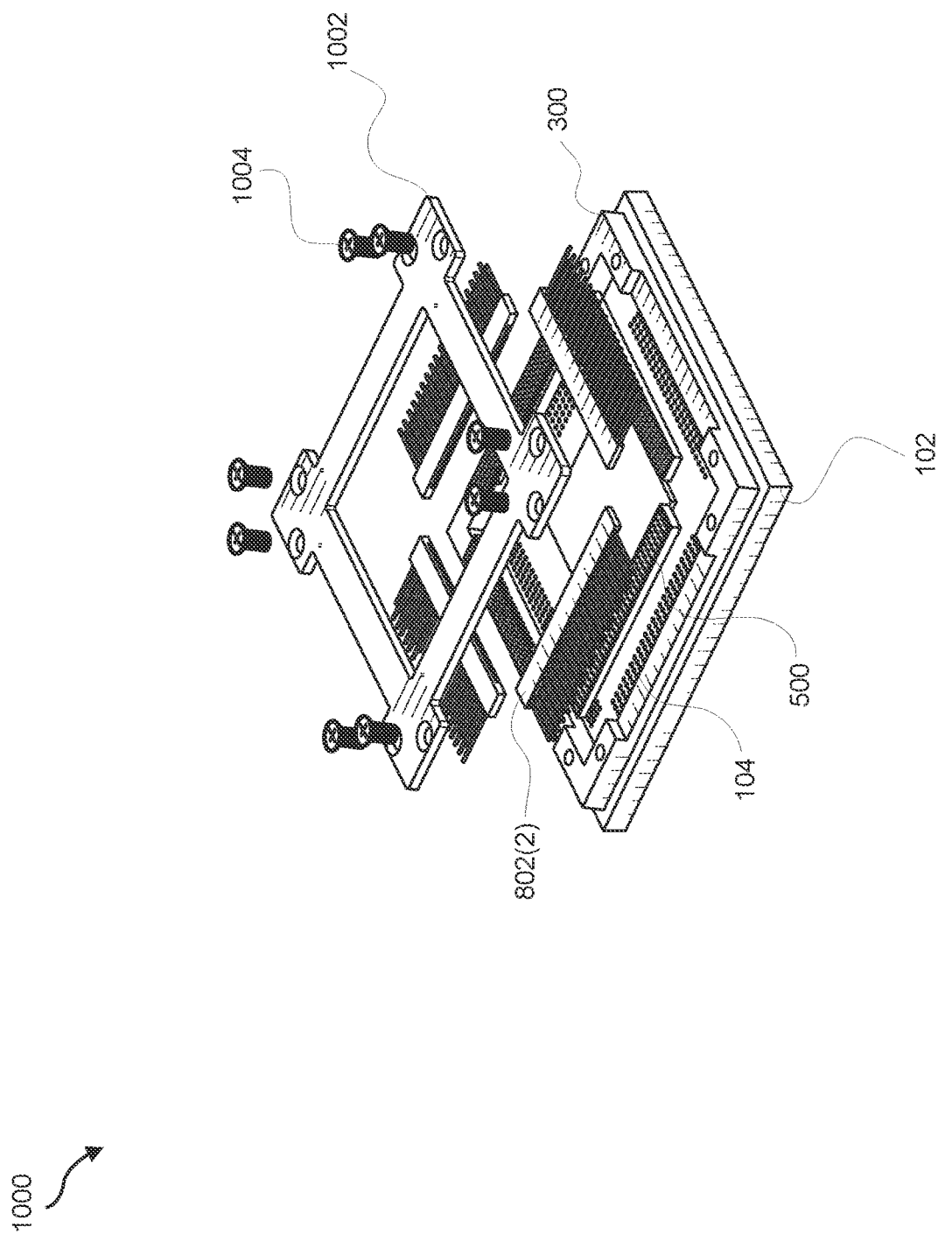
FIG. 10 is an illustration of another exemplary apparatus for utilizing package stiffeners to attach cable assemblies to integrated circuits.
Figure 11:
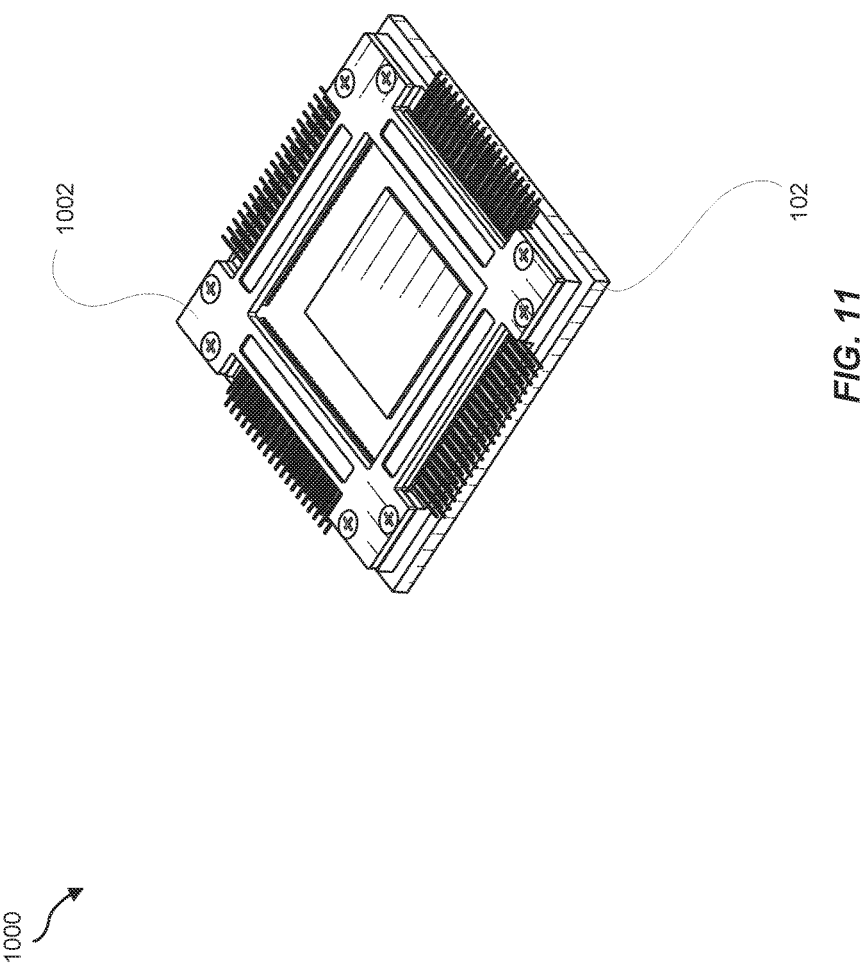
FIG. 11 is another illustration of the other exemplary apparatus for utilizing package stiffeners to attach cable assemblies to integrated circuits.

FIGS. 10 and 11 illustrates an exemplary apparatus 1000 that utilizes package stiffener 300 to electrically couple cable assemblies 802(1)-(4) to integrated circuit 106. In some examples, like apparatus 800 in FIG. 8, exemplary apparatus 1000 may include and/or represent integrated circuit 106, substrate 102, package stiffener 300, interposers 500(1)-(4), and/or cable assemblies 802(1)-(4). As illustrated in FIGS. 10 and 11, apparatus 800 may also include and/or represent a load frame 1002 that is physically coupled to package stiffener 300. This physical coupling of load frame 1002 to package stiffener 300 may effectively compress cable assemblies 802(1)-(4) against interposers 500(1)-(4). In other words, load frame 1002 may apply a force that presses cable assemblies 802(1)-(4) against interposers 500(1)-(4). By doing so, load frame 1002 may reinforce and/or maintain the electrical couplings between cable assemblies 802(1)-(4) and interposers 500(1)-(4).

In some examples, apparatus 1000 may include and/or incorporate one or more attachment mechanisms 1004 for physically coupling load frame 1002 to package stiffener 300. For example, attachment mechanisms 1004 may each include and/or represent a screw and/or bolt that facilitates securing and/or pressing load frame 1002 to or against package stiffener 300. Additional examples of attachment mechanisms 1004 include, without limitation, fasteners, screws, pins, spring-loaded locking mechanisms, adhesives, bolts, latches, anchors, ties, straps, nuts, threads, portions of one or more of the same, combinations and/or variations of one or more of the same, and/or any other suitable attachment mechanisms.

Figure 12:
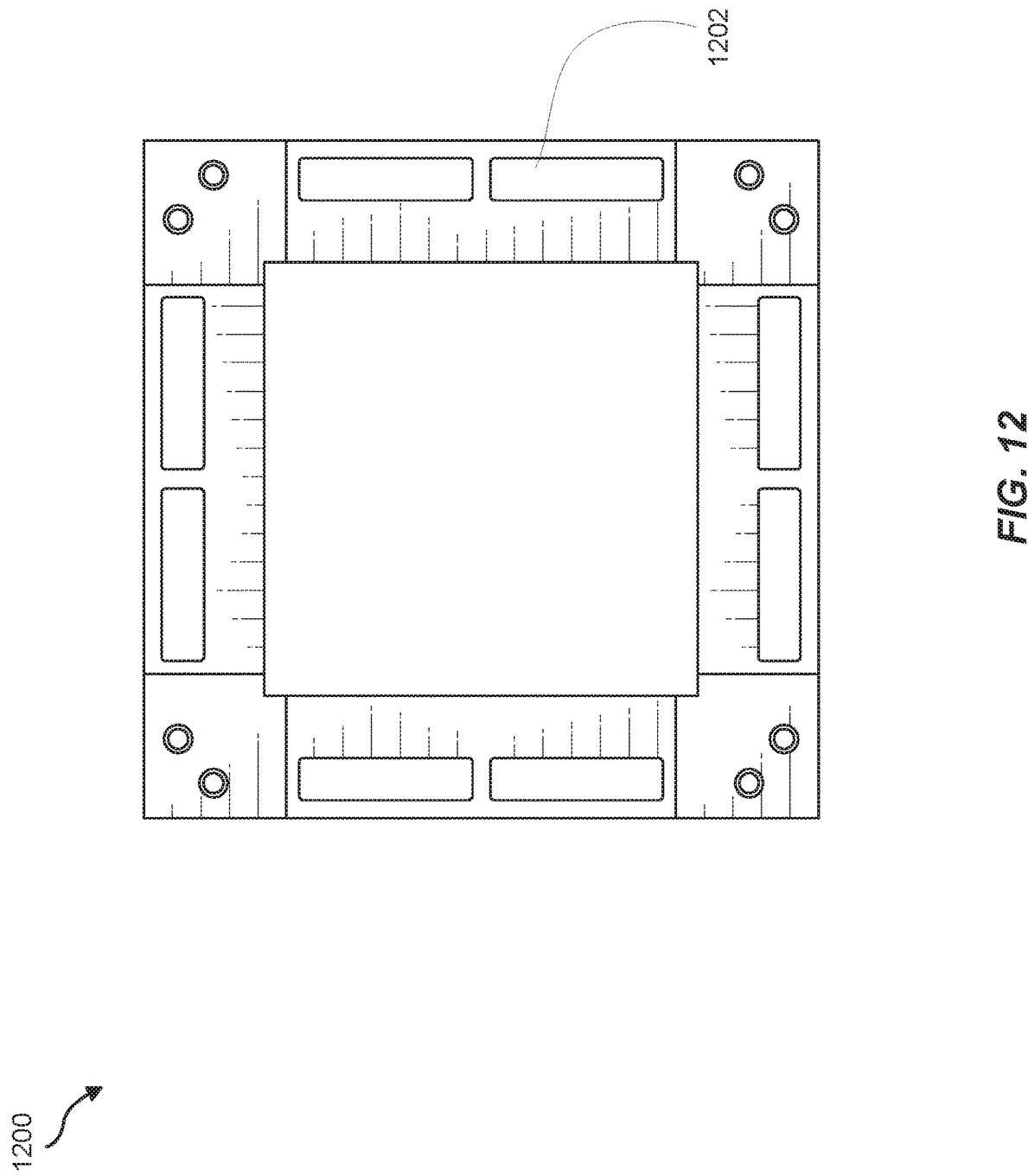
FIG. 12 is an illustration of an additional exemplary package stiffener.
Figure 13:
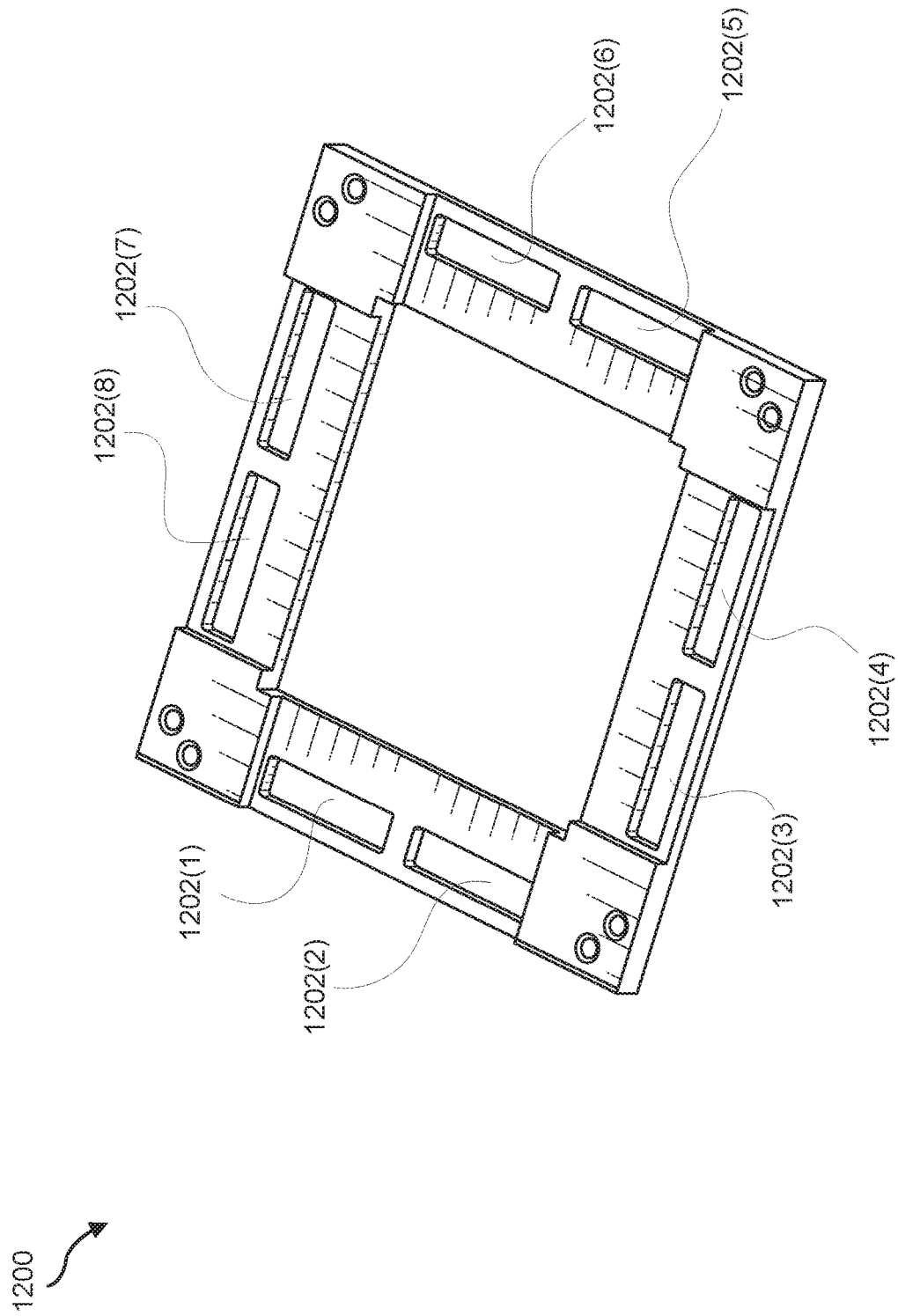
FIG. 13 is another illustration of the additional exemplary package stiffener.

FIGS. 12 and 13 illustrate an exemplary package stiffener 1200 capable of being physically coupled to substrate 102. In some examples, like package stiffener 300 in FIGS. 3 and 4, package stiffener 1200 may include and/or represent any type or form of physical material, structure, and/or support feature that fastens, couples, and/or adheres to a substrate of an integrated circuit. In one example, package stiffener 1200 may include and/or represent a ring that is fixed to the top surface of the substrate of a lidless integrated circuit. In this example, package stiffener 1200 may at least partially surround and/or encompass the die of the lidless integrated circuit.

In some examples, package stiffener 1200 may include, represent, and/or be shaped as a window frame that has and/or forms at least one opening 1202. For example, and as illustrated in FIG. 13, package stiffener 1200 may include and/or form openings 1202(1), 1202(2), 1202(3), 1202(4), 1202(5), 1202(6), 1202(7), and/or 1202(8). In this example, openings 1202(1) and 1202(2) may be placed and/or positioned along a first border and/or side of package stiffener 1200, and openings 1202(3) and 1202(4) may be placed and/or positioned along a second border and/or side of package stiffener 1200. In addition, openings 1202(5) and 1202(6) may be placed and/or positioned along a third border and/or side of package stiffener 1200, and openings 1202(7) and 1202(8) may be placed and/or positioned along a fourth border and/or side of package stiffener 1200. In some embodiments, openings 1202(1)-(8) may be placed and/or positioned along package stiffener 1200 to align and/or match with the different sets of electrical contacts 104 disposed on substrate 102.

Figure 14:
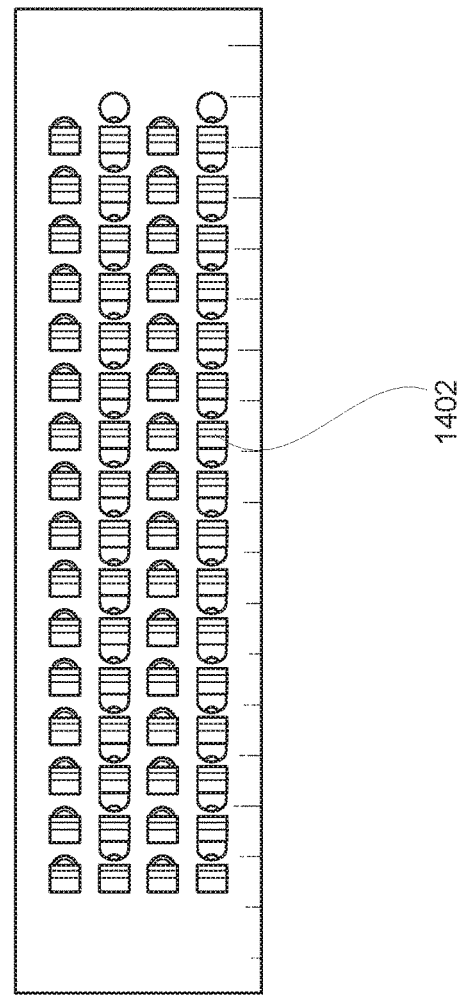
FIG. 14 is an illustration of an additional exemplary interposer.
Figure 15:
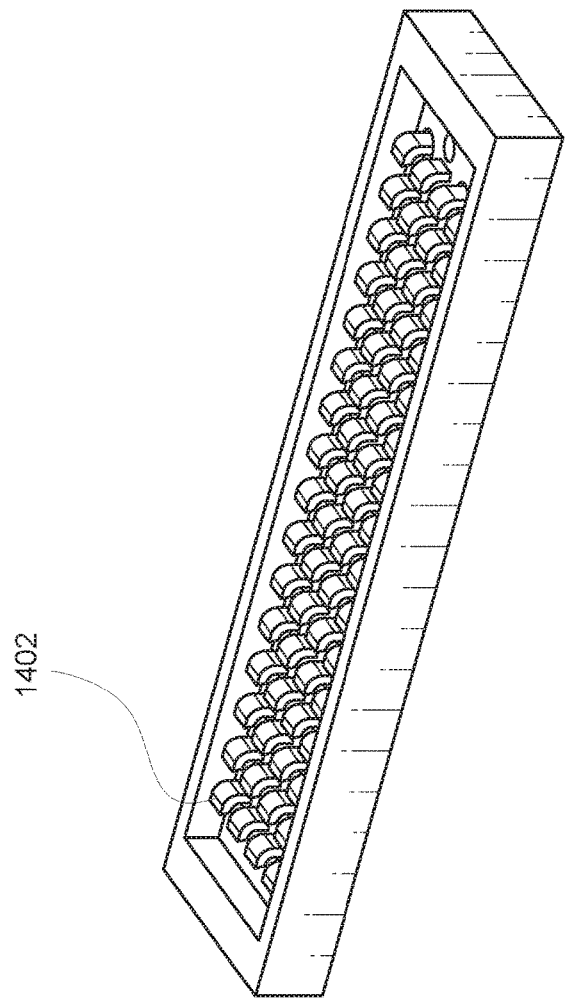
FIG. 15 is another illustration of the additional exemplary interposer.

FIGS. 14 and 15 illustrate an exemplary interposer 1400 that facilitates electrically coupling one or more cable assemblies to electrical contacts 104 disposed on substrate 102. As illustrated in FIGS. 14 and 15, exemplary interposer 1400 may include and/or represent a plurality of contact pins 1402 laid out and/or arranged to correspond to and/or mate with electrical contacts 104. In some examples, contact pins 1402 may be disposed through and/or across interposer 1400 (in, e.g., an LGA or BGA configuration and/or format). In such examples, contact pins 1402 may include and/or represent a plurality of conductors incorporated into and/or arranged across interposer 1400.

In one example, contact pins 1402 may be spaced a certain distance and/or pitch (e.g., approximately 1 millimeter) from one another on interposer 1400. In this example, each contact pin may include and/or represent a single conductive piece and/or unit that facilitates electrical continuity from one side of interposer 1400 to the other side. Additionally or alternatively, groups of contact pins 502 may constitute and/or represent signal pairs that run between integrated circuit 106 and another component included in the corresponding system at large.

Figure 16:
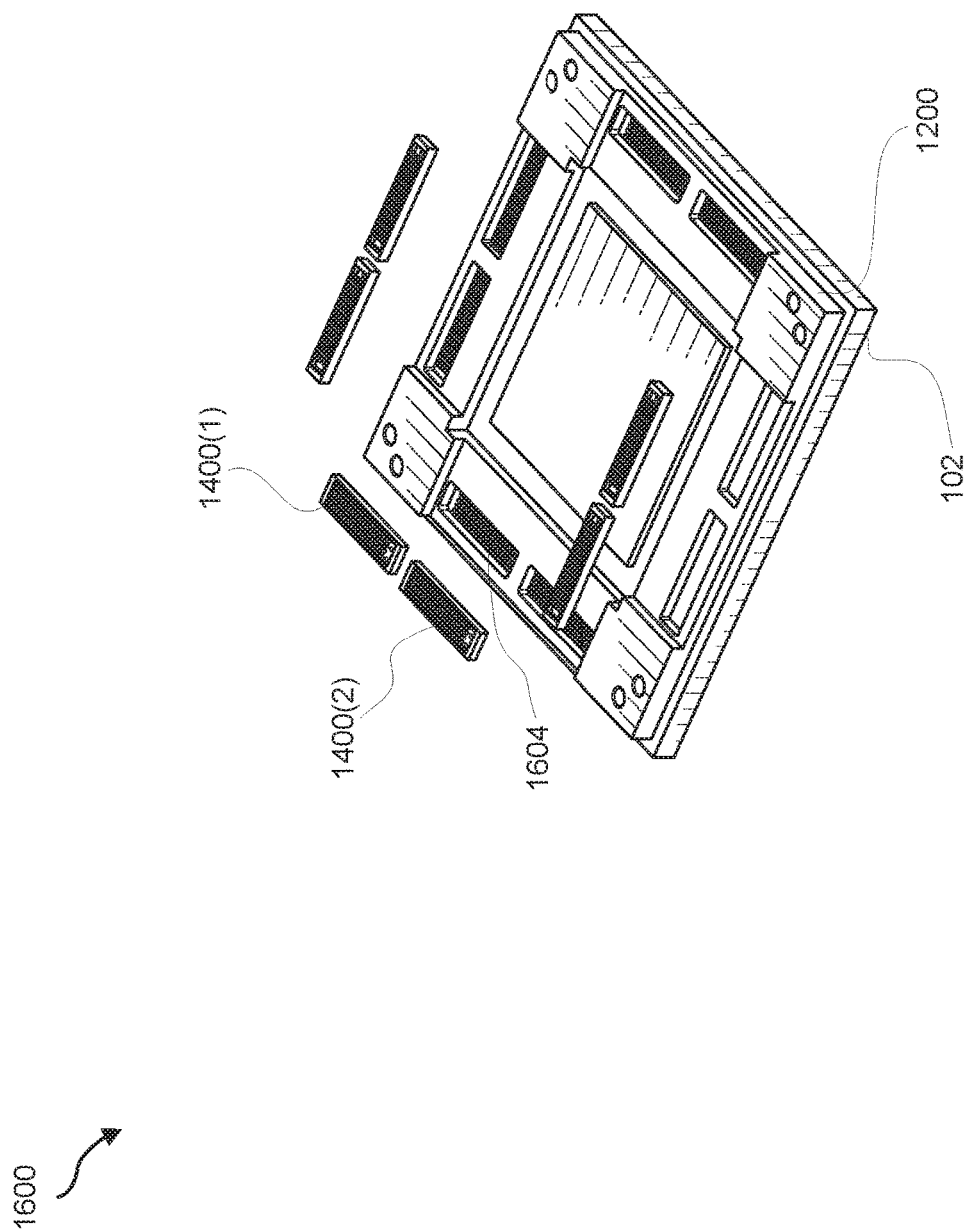
FIG. 16 is an illustration of an exemplary system for utilizing package stiffeners to attach cable assemblies to integrated circuits.
Figure 17:
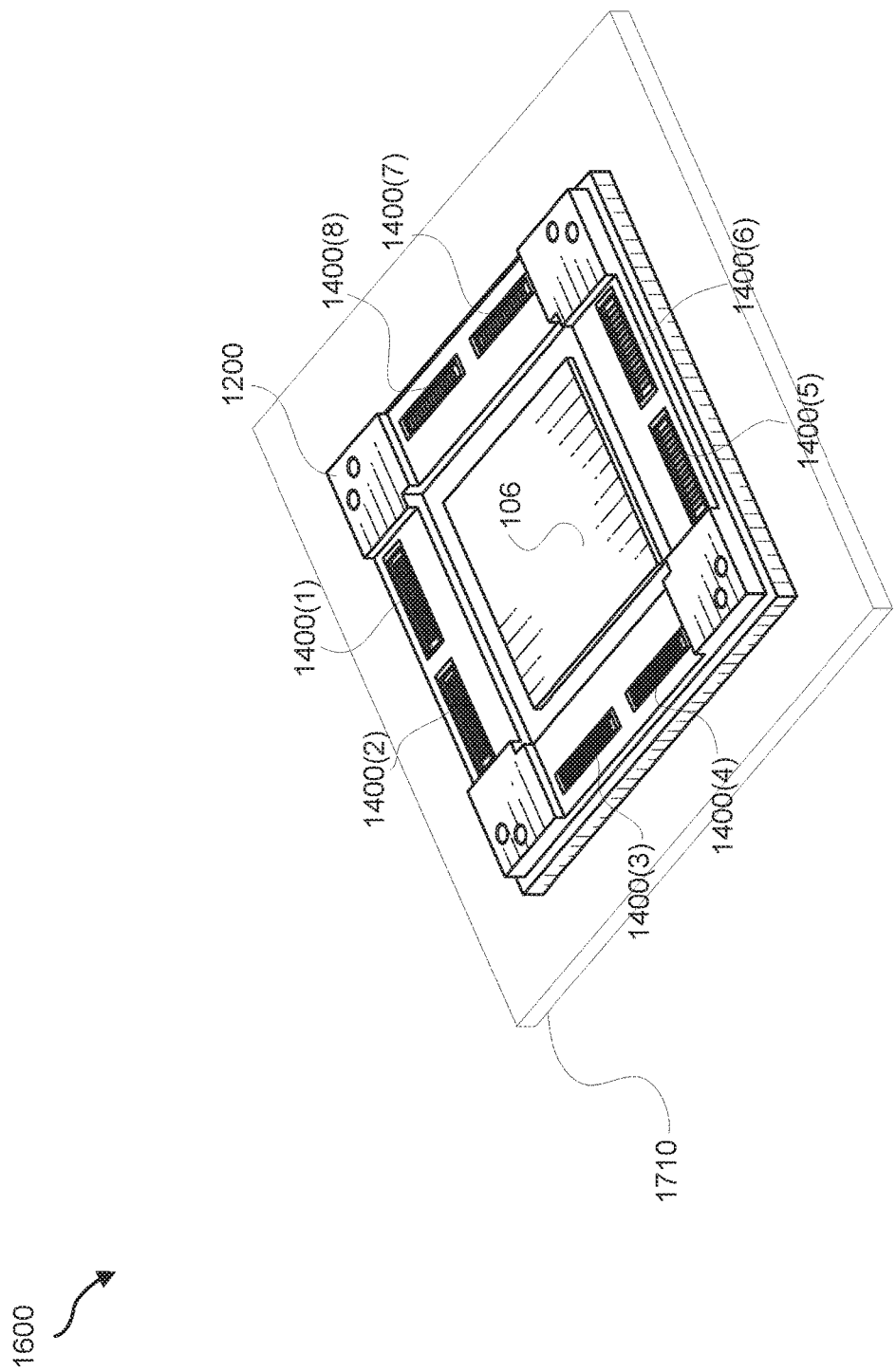
FIG. 17 is another illustration of the exemplary system for utilizing package stiffeners to attach cable assemblies to integrated circuits.

FIGS. 16 and 17 illustrate an exemplary system 1600 that utilizes package stiffener 1200 to attach cable assemblies to integrated circuit 106. In some examples, exemplary system 1600 may include and/or represent integrated circuit 106, substrate 102, package stiffener 1200, and/or interposers 1400(1), 1400(2), 1400(3), 1400(4), 1400(5), 1400(6), 1400(7), and/or 1400(8). In such examples, interposers 1400(1)-(8) may be electrically coupled to different sets of electrical contacts on substrate 102.

In some examples, integrated circuit 106 may be electrically coupled to substrate 102. In such examples, electrical contacts 104 may be disposed on substrate 102 and/or may be electrically coupled to integrated circuit 106 via substrate 102 such that electrical continuity exists between electrical contacts 104 and integrated circuit 106. In one example, package stiffener 300 may be physically coupled to substrate 102 around integrated circuit 106 such that one or more cable assemblies (not necessarily illustrated in FIG. 7) are still capable of being electrically coupled to electrical contacts 104 disposed on substrate 102.

In some examples, substrate 102 may be electrically coupled to a circuit board 1710 in FIG. 17. In such examples, certain electrical signals may traverse and/or pass among substrate 102, integrated circuit 106, and/or circuit board 1710.

Figure 18:
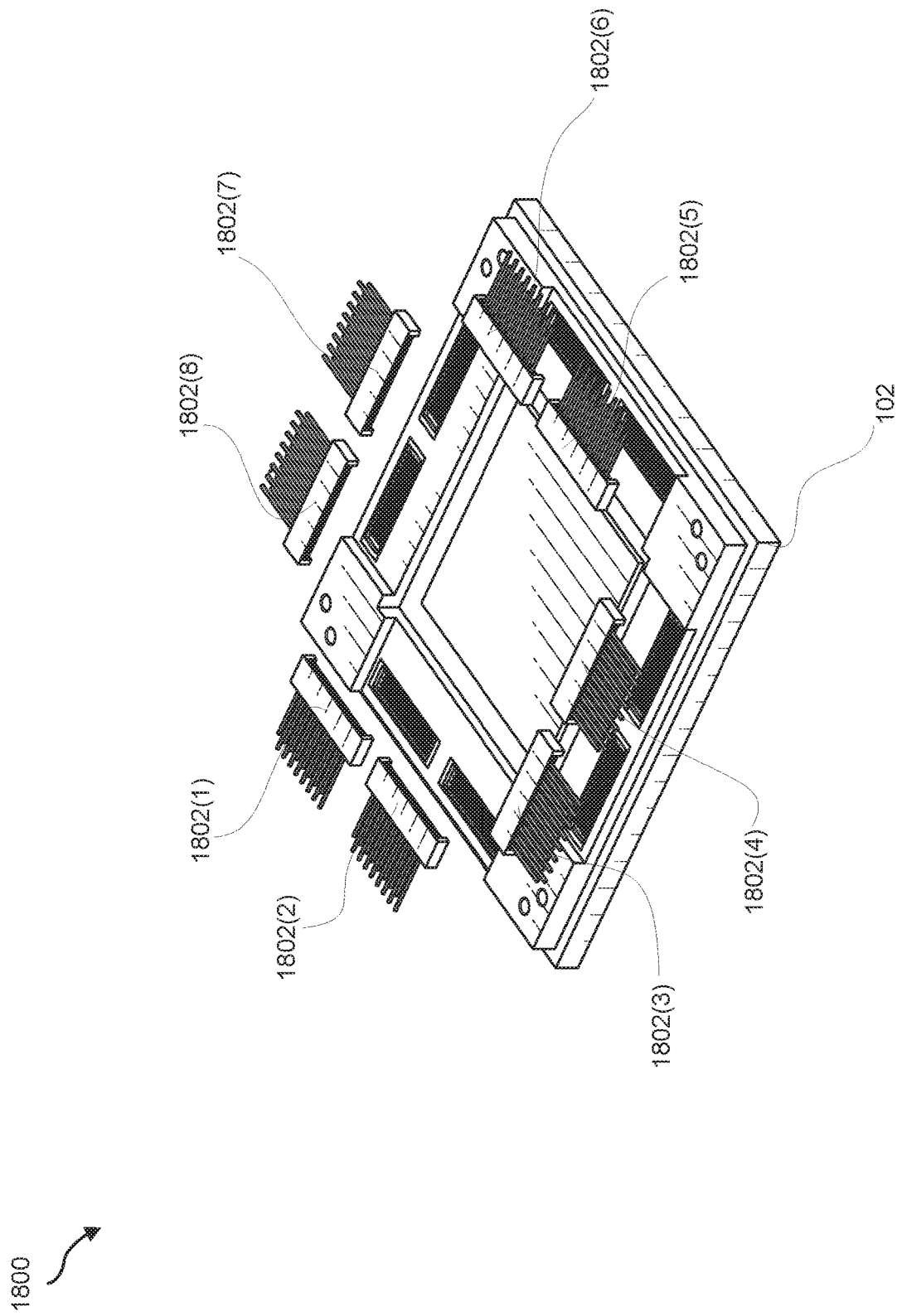
FIG. 18 is a further illustration of the exemplary system for utilizing package stiffeners to attach cable assemblies to integrated circuits.
Figure 19:
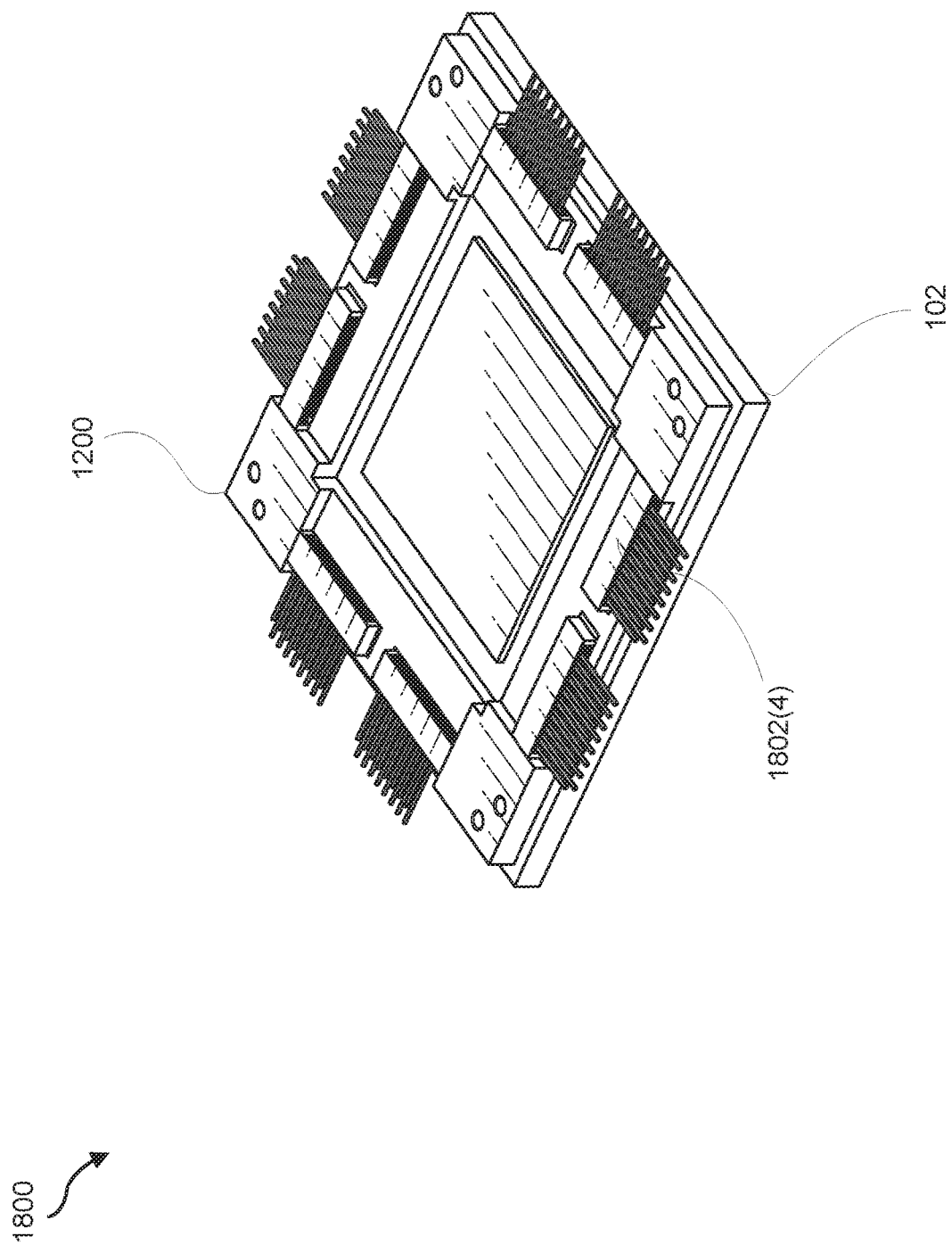
FIG. 19 is an additional illustration of the exemplary system for utilizing package stiffeners to attach cable assemblies to integrated circuits.

FIGS. 18 and 19 illustrate an exemplary system 1800 that utilizes package stiffener 300 to electrically couple cable assemblies 1802(1), 1802(2), 1802(3), 1802(4), 1802(5), 1802(6), 1802(7), and/or 1802(8) to integrated circuit 106. In some examples, like system 1600 in FIGS. 16 and 17, exemplary system 1800 may include and/or represent integrated circuit 106, substrate 102, package stiffener 1200, and/or interposers 1400(1)-(8). As illustrated in FIGS. 18 and 19, system 1800 may also include and/or represent cable assemblies 1802(1)-(8) that are electrically coupled to interposers 1400(1)-(8), respectively. Accordingly, interposers 1400(1)-(4) may be electrically coupled between the corresponding sets of electrical contacts on substrate 102 and cable assemblies 1802(1)-(8).

In some examples, cable assemblies 1802(1)-(8) may each include and/or represent an integration connector and a plurality of electrical pins. In such examples, the electrical pins of each cable assembly may be laid out and/or arranged to correspond to and/or mate with one of interposers 1400(1)-(8) and/or an electrical cable (not necessarily illustrated in FIGS. 18 and 19). In one example, the electrical pins may be integrated and/or grouped into a single unit that serves as a cable assembly. For example, the integration connectors may each hold and/or maintain the electrical pins in the arrangement needed to properly mate and/or couple an electrical cable with one of interposers 1400(1)-(8).

In some examples, package stiffener 1200 may be physically coupled along and/or near the perimeter of substrate 102 such that openings 1202(1)-(8) align and/or match with the different sets of electrical contacts 104 disposed on substrate 102. In one example, the sets of electrical contacts 104 may be positioned under openings 1202(1)-(8) formed by package stiffener 1200. As a result, the integration connector of each cable assembly may sit atop one set of electrical contacts 104 within the corresponding opening formed by package stiffener 1200, and the electrical pins of each cable assembly may run parallel to substrate 102 and/or extend outward from the corresponding opening formed by package stiffener 1200 toward the corresponding edge of substrate 102.

Figure 20:
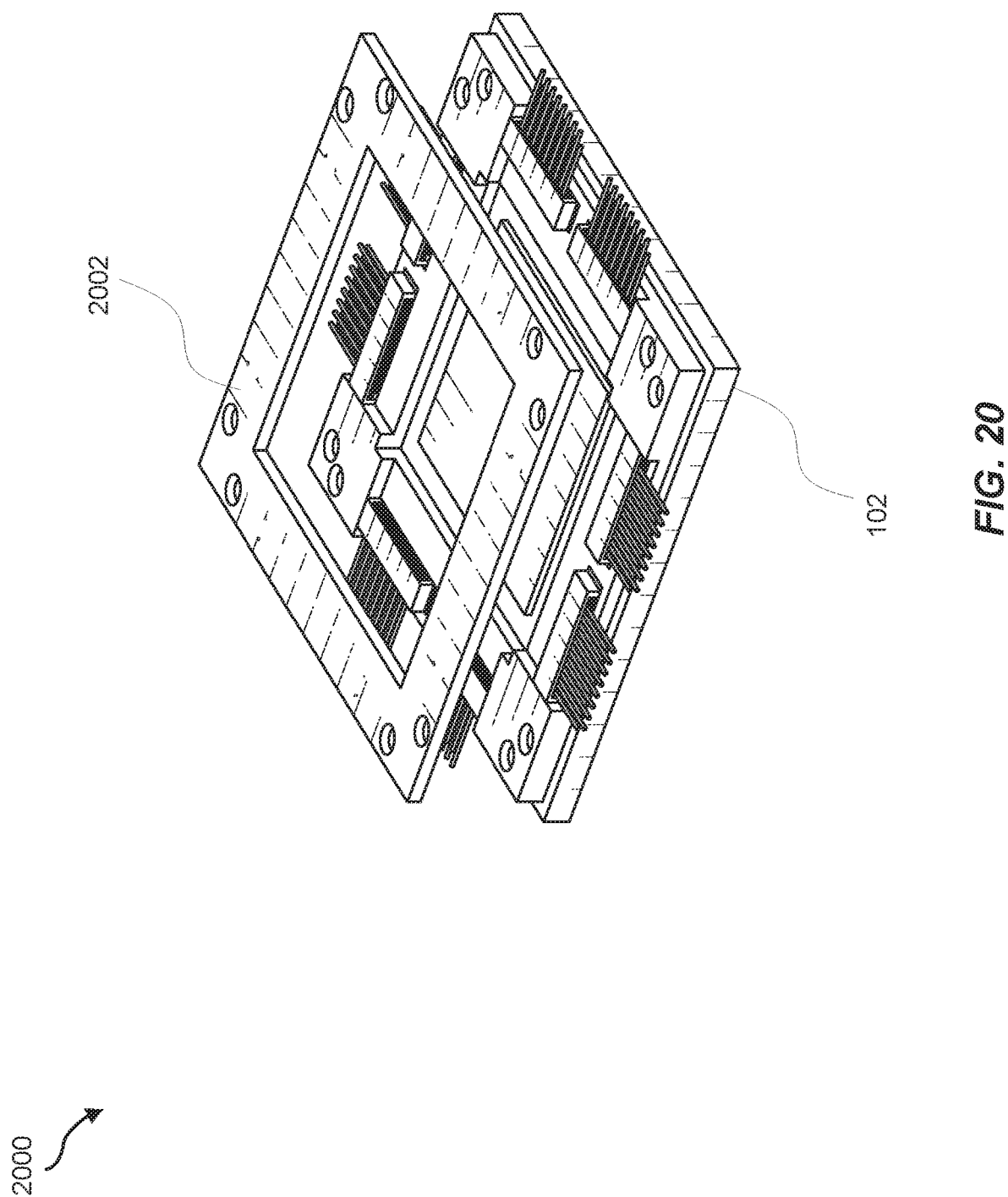
FIG. 20 is an illustration of an additional exemplary system for utilizing package stiffeners to attach cable assemblies to integrated circuits.
Figure 21:
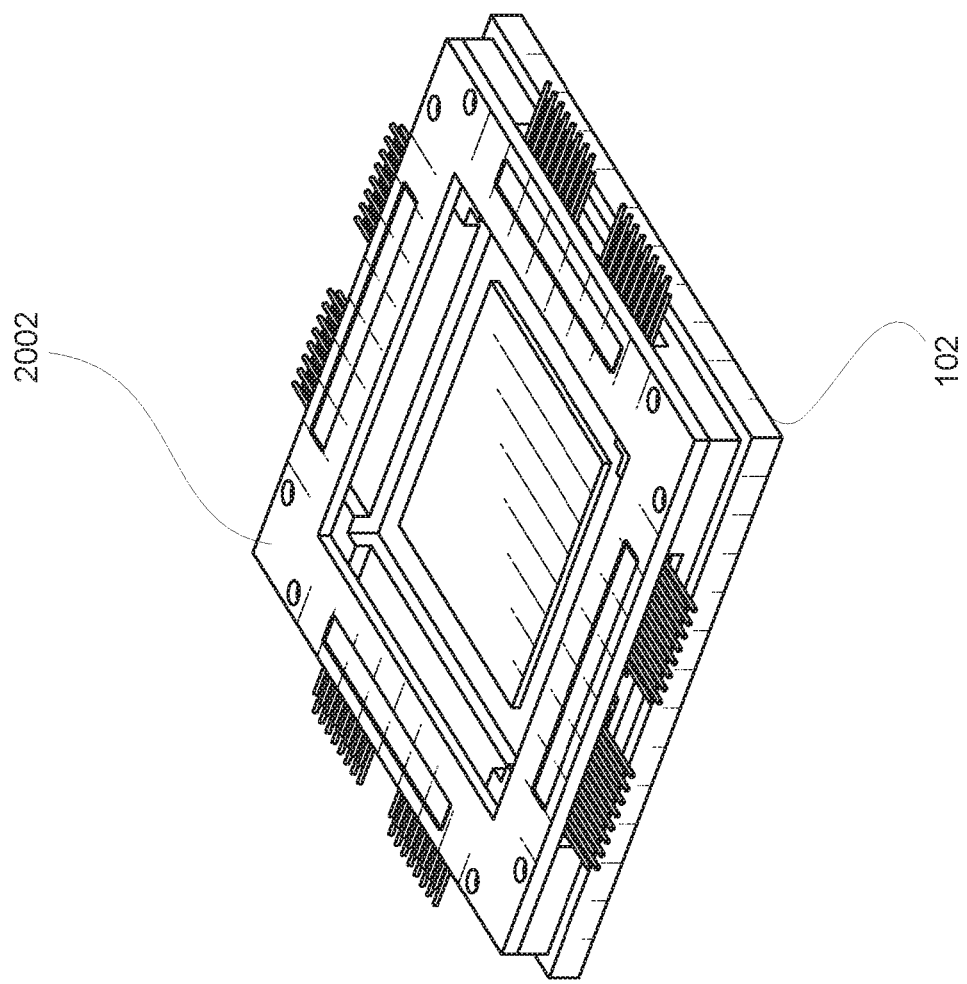
FIG. 21 is an illustration of the additional exemplary system for utilizing package stiffeners to attach cable assemblies to integrated circuits.

FIGS. 20 and 21 illustrate an exemplary system 2000 that utilizes package stiffener 1200 to electrically couple cable assemblies 1802(1)-(8) to integrated circuit 106. In some examples, like system 1800 in FIGS. 18 and 19, exemplary system 2000 may include and/or represent integrated circuit 106, substrate 102, package stiffener 1200, interposers 1400(1)-(8), and/or cable assemblies 1802(1)-(8). As illustrated in FIGS. 20 and 21, system 2000 may also include and/or represent a load frame 2002 that is physically coupled to package stiffener 1200. This physical coupling of load frame 2002 to package stiffener 1200 may effectively compress cable assemblies 1802(1)-(8) against interposers 1400(1)-(8). In other words, load frame 2002 may apply a force that presses cable assemblies 1802(1)-(8) against interposers 1400(1)-(8). By doing so, load frame 2002 may reinforce and/or maintain the electrical couplings formed between cable assemblies 1802(1)-(8) and interposers 1400(1)-(8).

Figure 22:
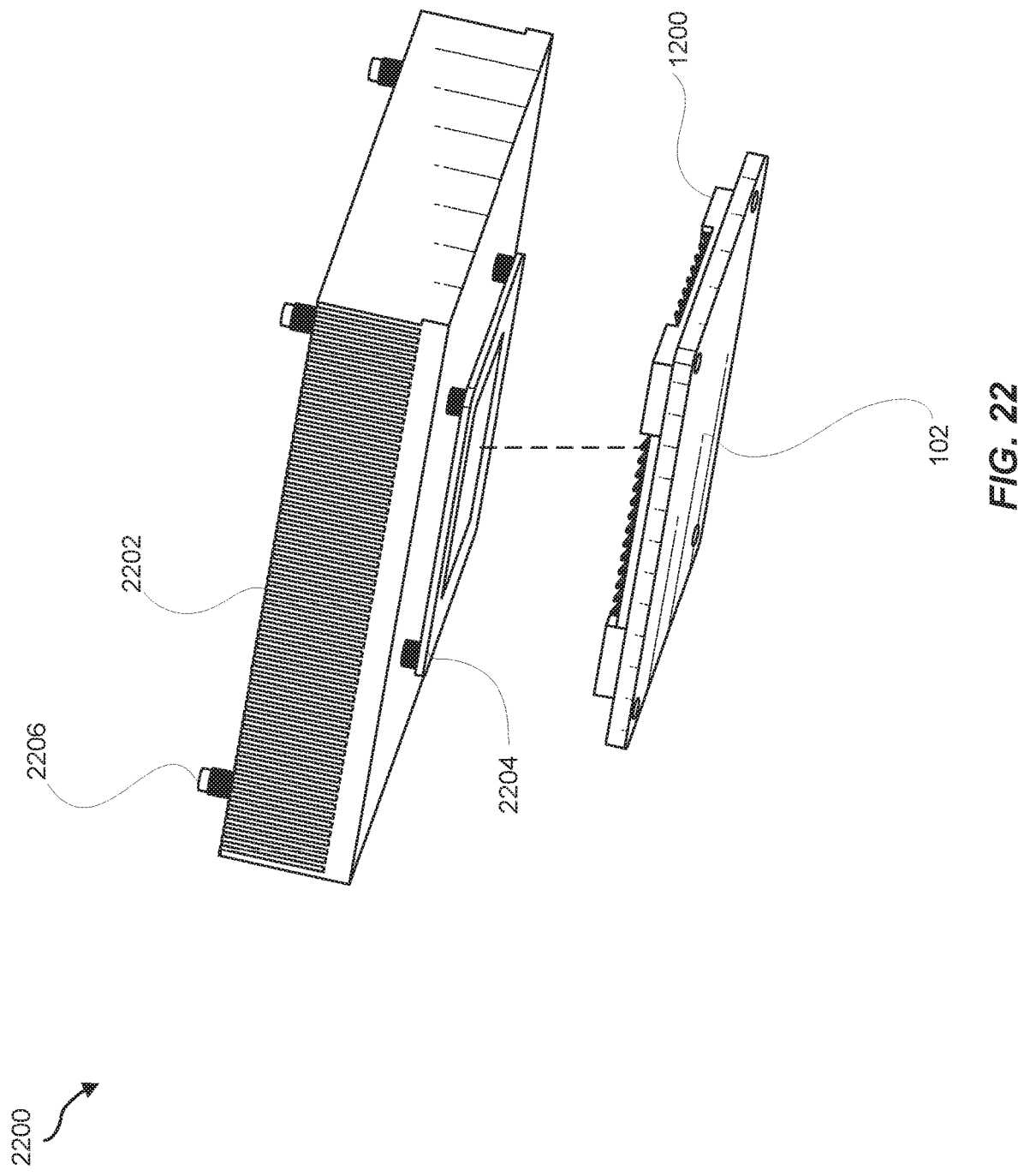
FIG. 22 is an illustration of another exemplary system for utilizing package stiffeners to attach cable assemblies to integrated circuits.
Figure 23:
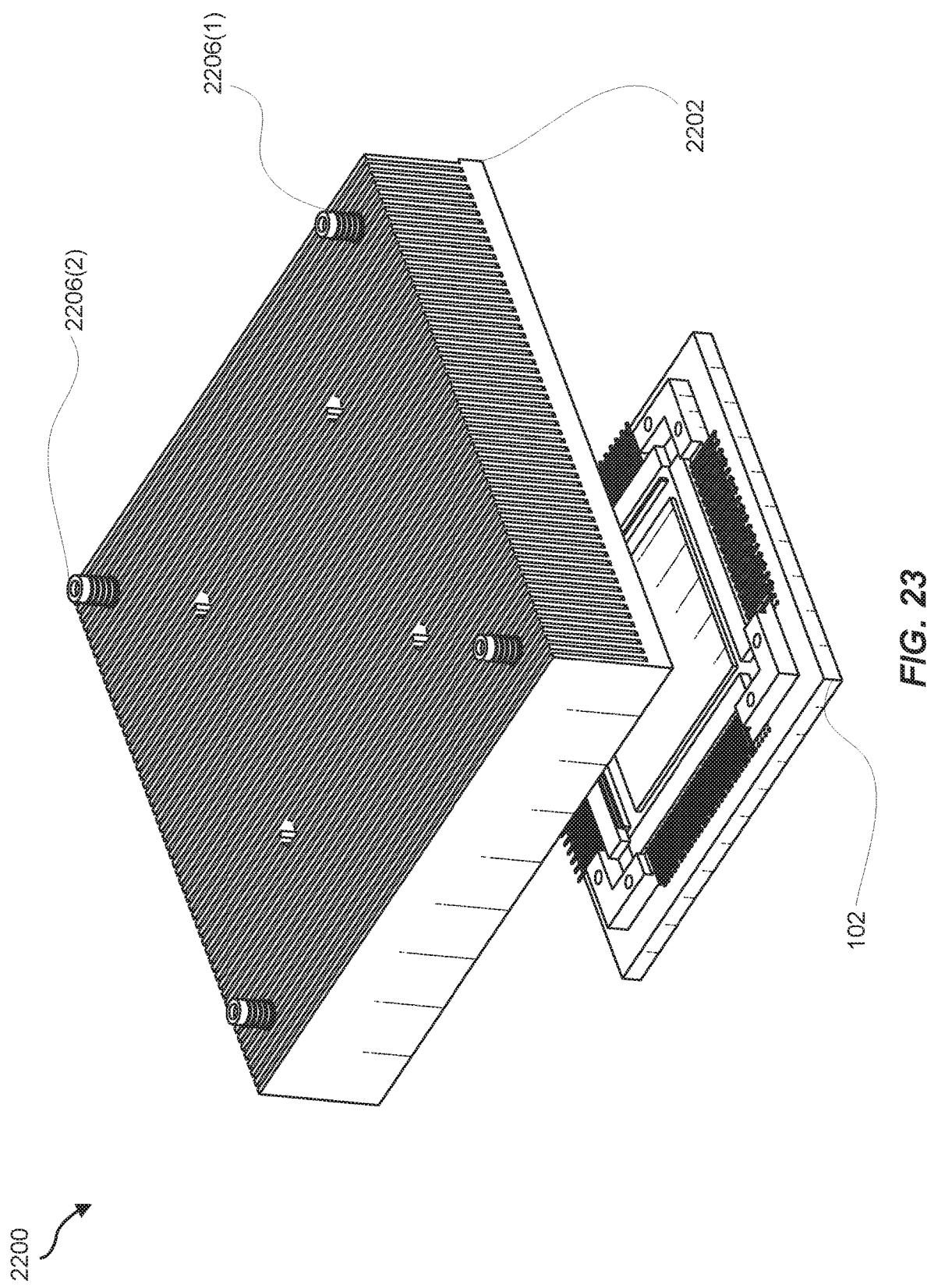
FIG. 23 is another illustration of the other exemplary system for utilizing package stiffeners to attach cable assemblies to integrated circuits.
Figure 24:
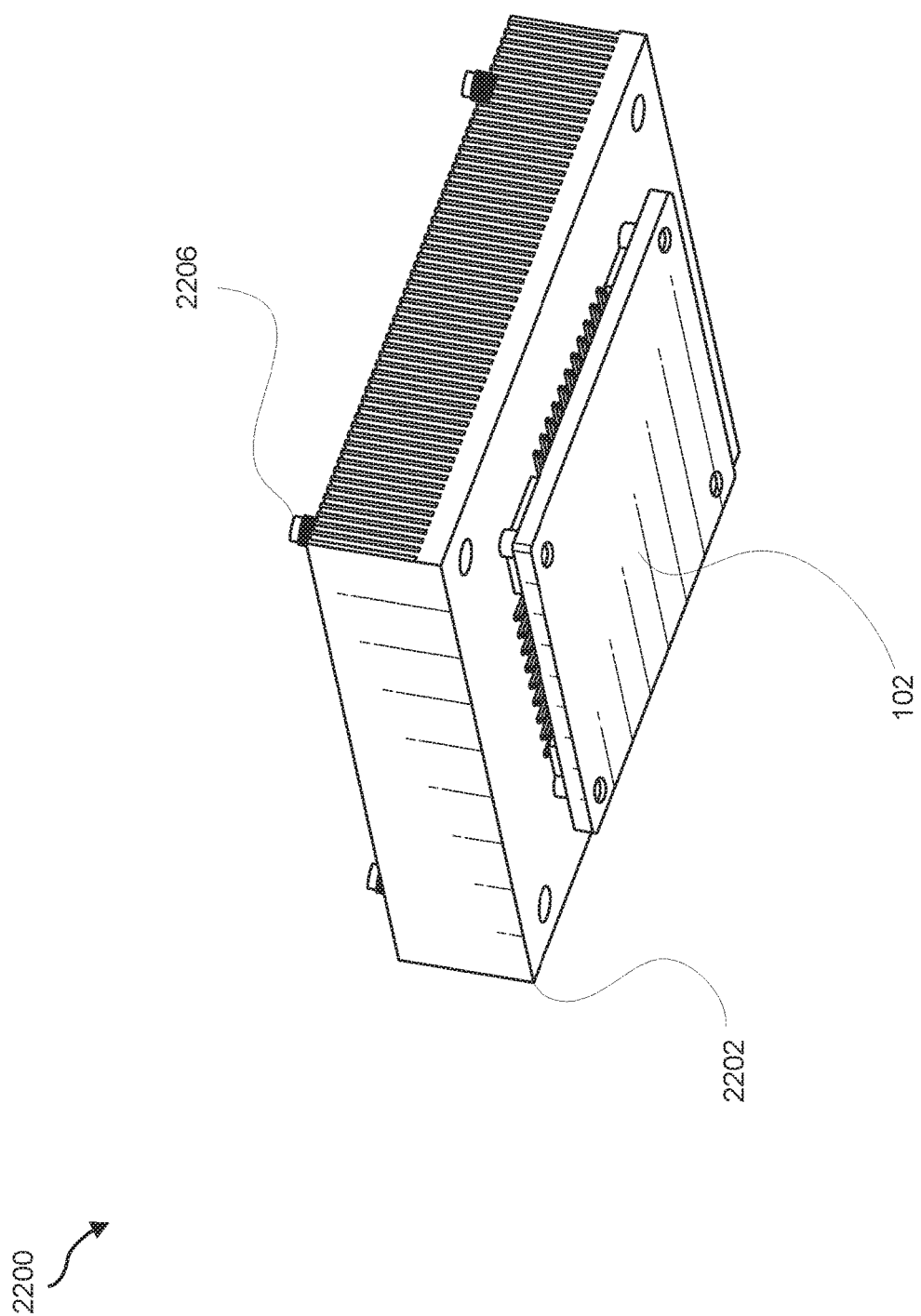
FIG. 24 is an additional illustration of the other exemplary system for utilizing package stiffeners to attach cable assemblies to integrated circuits.

FIGS. 22, 23, and 24 illustrate an exemplary system 2200 that utilizes package stiffener 1200 to electrically couple cable assemblies 1802(1)-(8) to integrated circuit 106. In some examples, like system 2000 in FIGS. 20 and 21, exemplary system 2200 may include and/or represent integrated circuit 106, substrate 102, package stiffener 1200, interposers 1400(1)-(8), and/or cable assemblies 1802(1)-(8). As illustrated in FIGS. 22-24, system 2200 may also include and/or represent a load frame 2204 incorporated into a heatsink 2202. In one example, heatsink 2202 may include and/or incorporate at least one spring-loaded attachment mechanism 2206. In this example, spring-loaded attachment mechanism 2206 may facilitate securing and/or attaching heatsink 2202 to substrate 102 and/or a circuit board (e.g., circuit board 1710 in FIG. 17).

In some examples, spring-loaded attachment mechanism 2206 may provide and/or serve as a shock absorber. Additionally or alternatively, spring-loaded attachment mechanism 2206 may account and/or compensate for variations and/or tolerances inherent and/or intrinsic to the manufacturing or assembly processes.

In some examples, heatsink 2202 may form a thermal coupling with integrated circuit 106. In other words, heatsink 2202 and integrated circuit 106 may interface with one another, thereby forming a thermal coupling that enables heatsink 2202 to absorb and/or draw heat emitted and/or generated by integrated circuit 106. In some examples, heatsink 2202 may include and/or any type or form of system, device, structure, and/or mechanism that conducts, transfers, absorbs, and/or sinks heat. Heatsinks may include and/or contain a variety of materials. Examples of such heatsink materials include, without limitation, copper, aluminum, diamond, alloys of one or more of the same, combinations or variations of one or more of the same, and/or any other suitable materials.

Figure 25:
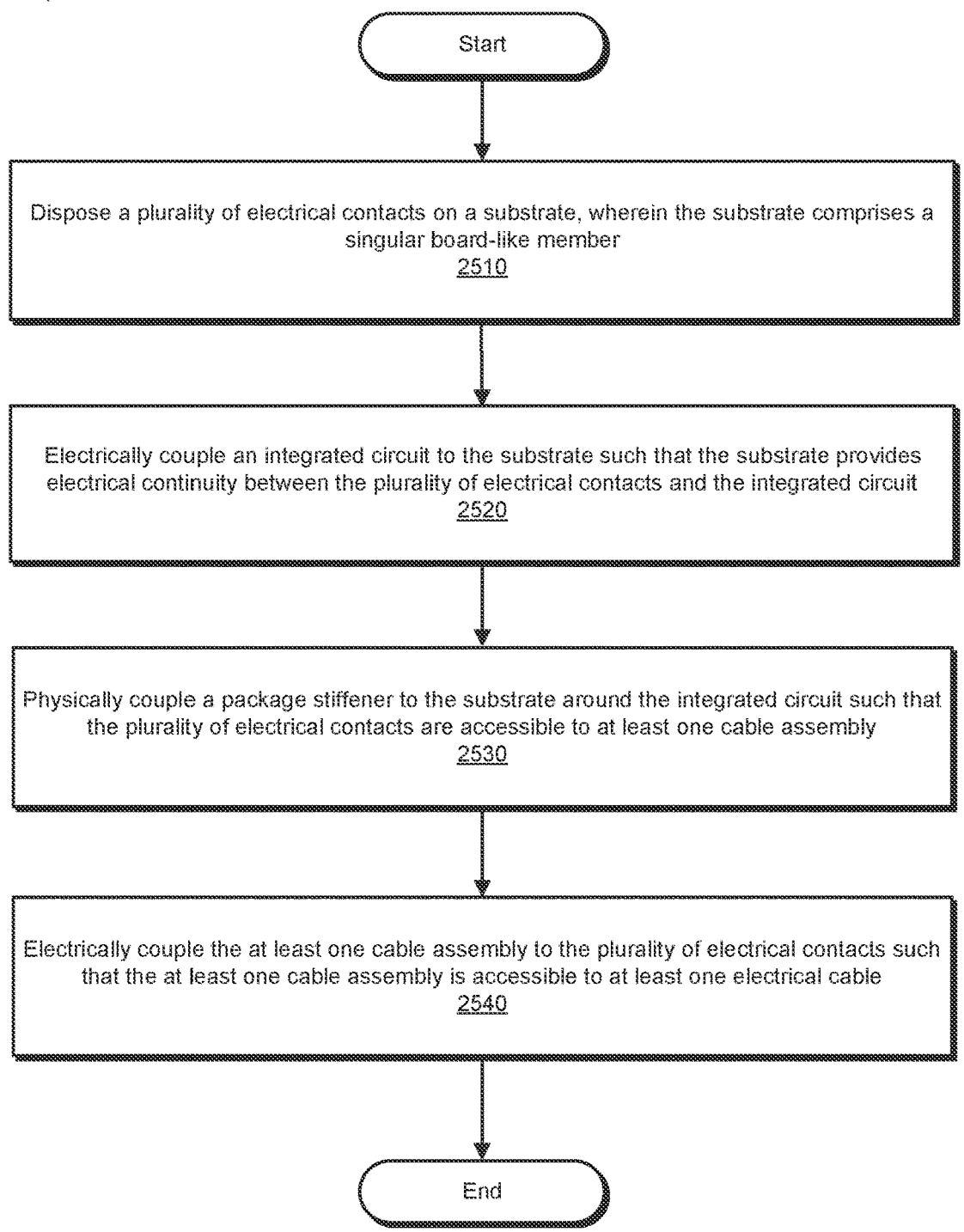
FIG. 25 is a flow diagram of an exemplary method for utilizing package stiffeners to attach cable assemblies to integrated circuits.

FIG. 25 is a flow diagram of an exemplary method 2500 for utilizing package stiffeners to attach cable assemblies to integrated circuits. Method 2500 may include the step of disposing a plurality of electrical contacts on a substrate (2510). Step 2510 may be performed in a variety of ways, including any of those described above in connection with FIGS. 1-24. For example, a computing equipment manufacturer or subcontractor may manufacture a substrate. In this example, as part of the manufacturing process, the computing equipment manufacturer or subcontractor may dispose a plurality of electrical contacts on, across, and/or through the substrate.

Method 2500 may also include the step of electrically coupling an integrated circuit to the substrate such that the substrate provides electrical continuity between the plurality of electrical contacts and the integrated circuit (2520). Step 2520 may be performed in a variety of ways, including any of those described above in connection with FIGS. 1-24. For example, the computing equipment manufacturer or subcontractor may electrically couple an integrated circuit to the substrate such that the substrate provides electrical continuity between the plurality electrical contacts and the integrated circuit. In one example, the computing equipment manufacturer or subcontractor may form and/or achieve this electrical coupling by soldering and/or reflow processes.

Method 2500 may, also include the step of physically coupling a package stiffener to the substrate around the integrated circuit such that the plurality of electrical contacts are accessible to at least one cable assembly (2530). Step 2530 may be performed in a variety of ways, including any of those described above in connection with FIGS. 1-24. For example, the computing equipment manufacturer or subcontractor may physically couple a package stiffener to the substrate around the integrated circuit such that each set of electrical contacts is accessible to a cable assembly. In some examples, this physical coupling may be formed and/or achieved through a number of different attachment means, including adhesives, screws, and/or nut and bolt pairings.

Method 2500 may also include the step of electrically coupling the at least one cable assembly to the plurality of electrical contacts such that the at least one cable assembly is accessible to at least one electrical cable (2540). Step 2540 may be performed in a variety of ways, including any of those described above in connection with FIGS. 1-24. For example, the computing equipment manufacturer or subcontractor may electrically couple a cable assembly to each set of electrical contacts disposed on the substrate such that the at least one cable assembly is accessible to at least one electrical cable. In one example, the computing equipment manufacturer or subcontractor may also place and/or position an interposer between each cable assembly and set of electrical contacts.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   an integrated circuit electrically coupled to a substrate, wherein the substrate comprises a singular board-like member;
   a plurality of electrical contacts that are disposed on the substrate and are electrically coupled to the integrated circuit via the substrate;
   a package stiffener physically coupled to the substrate around the integrated circuit such that the plurality of electrical contacts are accessible to at least one cable assembly; and
   the at least one cable assembly electrically coupled to the plurality of electrical contacts such that the at least one cable assembly is accessible to at least one electrical cable.

2. The apparatus of claim 1, further comprising at least one interposer electrically coupled between the plurality of electrical contacts and the at least one cable assembly.

3. The apparatus of claim 1, wherein the plurality of electrical contacts comprise at least one of:
   a set of high-density of Land Grid Array (LGA) pads; and
   a set of high-density of Ball Grid Array (BGA) pads.

4. The apparatus of claim 1, wherein:
   the substrate comprises a first edge, a second edge, a third edge, and a fourth edge; and
   the plurality of electrical contacts comprise:
      a first set of electrical contacts disposed proximate to the first edge;
      a second set of electrical contacts disposed proximate to the second edge;
      a third set of electrical contacts disposed proximate to the third edge; and
      a fourth set of electrical contacts disposed proximate to the fourth edge.

5. The apparatus of claim 1, further comprising a load frame physically coupled to the package stiffener such that the load frame compresses the at least one cable assembly against the plurality of electrical contacts.

6. The apparatus of claim 5, further comprising:
   a circuit board electrically coupled to the substrate; and
   a heatsink into which the load frame is incorporated, the heatsink comprising at least one spring-loaded attachment mechanism that secures the heatsink to the substrate.

7. The apparatus of claim 1, wherein the cable assembly comprises:
   an integration connector; and
   a plurality of electrical pins.

8. The apparatus of claim 7, wherein:
   the package stiffener comprises a window frame that is physically coupled along a perimeter of the substrate such that a certain amount of buffer space exists between the window frame and the integrated circuit atop the substrate; and
   the plurality of electrical contacts are positioned within the certain amount of buffer space between the window frame and the integrated circuit such that:
      the integration connector of the cable assembly sits atop at least a portion of the buffer space; and
      the plurality of electrical pins run parallel to the substrate and extend outward from the portion of buffer space toward an edge of the substrate.

9. The apparatus of claim 7, wherein:
   the package stiffener comprises a window frame that forms at least one opening;
   the plurality of electrical contacts are positioned under the at least one opening formed by the window frame such that:
      the integration connector of the cable assembly sits atop the plurality of electrical contacts within the opening formed by the window frame; and
      the plurality of electrical pins run parallel to the substrate and extend outward from the opening formed by the window frame toward an edge of the substrate.

10. The apparatus of claim 1, wherein the package stiffener is dimensioned to provide a certain amount of rigidity to the substrate to mitigate warpage of the substrate.

11. A system comprising:
    a substrate electrically coupled to a circuit board, wherein the substrate comprises a singular board-like member;
    an integrated circuit electrically coupled to the substrate;
    a plurality of electrical contacts that are disposed on the substrate and are electrically coupled to the integrated circuit via the substrate;
    a package stiffener physically coupled to the substrate around the integrated circuit such that the plurality of electrical contacts are accessible to at least one cable assembly; and the at least one cable assembly electrically coupled to the plurality of electrical contacts such that the at least one cable assembly is accessible to at least one electrical cable.

12. The system of claim 11, further comprising at least one interposer electrically coupled between the plurality of electrical contacts and the at least one cable assembly.

13. The system of claim 11, wherein the plurality of electrical contacts comprise at least one of:
   a set of high-density of Land Grid Array (LGA) pads; and
   a set of high-density of Ball Grid Array (BGA) pads.

14. The system of claim 11, wherein:
   the substrate comprises a first edge, a second edge, a third edge, and a fourth edge; and
   the plurality of electrical contacts comprise:
      a first set of electrical contacts disposed proximate to the first edge;
      a second set of electrical contacts disposed proximate to the second edge;
      a third set of electrical contacts disposed proximate to the third edge; and
      a fourth set of electrical contacts disposed proximate to the fourth edge.

15. The system of claim 11, further comprising a load frame physically coupled to the package stiffener such that the load frame compresses the at least one cable assembly against the plurality of electrical contacts.

16. The system of claim 15, wherein the load frame is incorporated into a heatsink that interfaces with a top surface of the integrated circuit, the heatsink comprising at least one spring-loaded member that secures the heatsink to the substrate.

17. The system of claim 11, wherein the cable assembly comprises:
   an integration connector; and
   a plurality of electrical pins.

18. The system of claim 17, wherein:
   the package stiffener comprises a window frame that is physically coupled along a perimeter of the substrate such that a certain amount of buffer space exists between the window frame and the integrated circuit atop the substrate; and
   the plurality of electrical contacts are positioned within the certain amount of buffer space between the window frame and the integrated circuit such that:
      the integration connector of the cable assembly sits atop at least a portion of the buffer space; and
      the plurality of electrical pins run parallel to the substrate and extend outward from the portion of buffer space toward an edge of the substrate.

19. The system of claim 17, wherein:
   the package stiffener comprises a window frame that forms at least one opening;
   the plurality of electrical contacts are positioned under the at least one opening formed by the window frame such that:
      the integration connector of the cable assembly sits atop the plurality of electrical contacts within the opening formed by the window frame; and
      the plurality of electrical pins run parallel to the substrate and extend outward from the opening formed by the window frame toward an edge of the substrate.

20. A method comprising:
   disposing a plurality of electrical contacts on a substrate, wherein the substrate comprises a singular board-like member;
   electrically coupling an integrated circuit to the substrate such that the substrate provides electrical continuity between the plurality of electrical contacts and the integrated circuit;
   physically coupling a package stiffener to the substrate around the integrated circuit such that the plurality of electrical contacts are accessible to at least one cable assembly; and
   electrically coupling the at least one cable assembly to the plurality of electrical contacts such that the at least one cable assembly is accessible to at least one electrical cable.

\* \* \* \* \*